US012796250B2

(12) United States Patent
Kim et al.

(10) Patent No.: US 12,796,250 B2
(45) Date of Patent: Nov. 10, 2026

(54) DISPLAY APPARATUS

(71) Applicant: Samsung Display Co., Ltd., Yongin-si (KR)

(72) Inventors: Sunghwan Kim, Yongin-si (KR); Hwansoo Jang, Yongin-si (KR); Daehyun Kim, Yongin-si (KR); Heyjin Shin, Yongin-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 346 days.

(21) Appl. No.: 18/492,936

(22) Filed: Oct. 24, 2023

(65) Prior Publication Data

US 2024/0244907 A1 Jul. 18, 2024

(30) Foreign Application Priority Data

Jan. 12, 2023 (KR) ........................ 10-2023-0004924

(51) Int. Cl.

*H10K 59/131* (2023.01)
*H10K 59/121* (2023.01)
*H10K 59/122* (2023.01)
*H10K 59/35* (2023.01)

(52) U.S. Cl.

CPC ....... *H10K 59/131* (2023.02); *H10K 59/1213* (2023.02); *H10K 59/1216* (2023.02); *H10K 59/122* (2023.02); *H10K 59/353* (2023.02)

(58) Field of Classification Search

None

See application file for complete search history.

(56) References Cited

U.S. PATENT DOCUMENTS 10,591,753 B2 3/2020 Kim et al.
10,707,285 B2 7/2020 Kwon et al.
2017/0147121 A1 5/2017 Yang et al.
2018/0247988 A1 * 8/2018 Lee ...................... H10K 59/123
2023/0046219 A1 2/2023 Lee et al.
2023/0209927 A1 * 6/2023 Jo ........................ H10K 59/122 257/72
2023/0217751 A1 7/2023 Kim et al.

FOREIGN PATENT DOCUMENTS

CN 111384083 7/2020
CN 217641344 U 10/2022
KR 10-2018-0030365 3/2018
KR 10-2019-0024464 3/2019
KR 10-2023-0104453 7/2023

* cited by examiner

*Primary Examiner* — Jay C Chang

(74) *Attorney, Agent, or Firm* — F. CHAU & ASSOCIATES, LLC

(57) ABSTRACT

A display apparatus includes a driving voltage line disposed on a substrate and extending in a first direction, a data line extending in the first direction and apart from the driving voltage line, a first sub-pixel electrode in which a first emission area is defined, and a second sub-pixel electrode in which a second emission area is defined. The first emission area overlaps the data line in a plan view, and the second emission area is disposed inside an edge of the driving voltage line.

20 Claims, 19 Drawing Sheets

DISPLAY APPARATUS

CROSS-REFERENCE TO RELATED APPLICATION(S)

This application claims priority to and benefits of Korean Patent Application No. 10-2023-0004924 under 35 U.S.C. § 119, filed on Jan. 12, 2023 in the Korean Intellectual Property Office, the entire contents of which are incorporated herein by reference.

BACKGROUND

1. Technical Field

One or more embodiments relate to a display apparatus.

2. Description of the Related Art

As the field of display devices for visually expressing various electrical signal information develops rapidly, various display apparatuses having excellent characteristics, such as thinness, light weight, and low power consumption, have been introduced. As the resolution of display apparatuses increases, a light-emitting element, transistors and capacitors driving the light-emitting element, and wires transmitting signals thereto are disposed to overlap each other, and accordingly, various issues may occur.

SUMMARY

One or more embodiments include a display apparatus capable of reducing an asymmetric color shift phenomenon and securing excellent visibility while reducing a characteristic difference between sub-pixels of different colors. However, the one or more embodiments are just examples, and the scope of the disclosure is not limited thereby.

Additional aspects will be set forth in part in the description which follows and, in part, will be apparent from the description, or may be learned by practice of the presented embodiments of the disclosure.

According to one or more embodiments, a display apparatus may include a driving voltage line disposed on a substrate and extending in a first direction, a data line extending in the first direction and apart from the driving voltage line, a first sub-pixel electrode in which a first emission area is defined, and a second sub-pixel electrode in which a second emission area is defined. The first emission area may overlap the data line in a plan view, and the second emission area is disposed inside an edge of the driving voltage line.

The driving voltage line may include a plurality of main portions, and a plurality of sub-portions extending in the first direction and connecting the plurality of main portions, the first emission area may overlap at least one sub-portion of the plurality of sub-portions in a plan view, and the second emission area may overlap one main portion of the plurality of main portions in a plan view.

Each of the main portions of the driving voltage line may include a first edge and a second edge, which are disposed opposite to each other with the second emission area therebetween and which extend in the first direction, and in a plan view, a shortest distance from the first edge to the second emission area may be equal to a shortest distance from the second edge to the second emission area.

Each of the main portions of the driving voltage line may include a third edge and a fourth edge, which are disposed opposite to each other with the second emission area therebetween and extend in a second direction perpendicular to the first direction, and in a plan view, a shortest distance from the third edge to the second emission area may be equal to a shortest distance from the fourth edge to the second emission area.

The display apparatus may further include a lower conductive layer disposed under the driving voltage line, and a first insulating layer disposed between the driving voltage line and the lower conductive layer, wherein a plurality of holes through which the driving voltage line and the lower conductive layer contact each other may be defined in the first insulating layer.

The plurality of holes may include a first hole and a second hole, which overlap one first emission area in a plan view, and the first hole and the second hole may be disposed on an imaginary straight line passing, in the first direction, through a center of the first emission area.

The first hole and the second hole may be arranged to be symmetrical to each other with respect to an imaginary straight line passing, in a second direction perpendicular to the first direction, through the center of the first emission area.

The first emission area may have a shape symmetrical with respect to an imaginary straight line passing, in the first direction, through a center of the first emission area, and the first emission area may have a shape symmetrical with respect to an imaginary straight line passing, in a second direction perpendicular to the first direction, through the center of the first emission area.

The second emission area may have a shape symmetrical with respect to an imaginary straight line passing, in a direction intersecting the first direction and a second direction perpendicular to the first direction, through a center of the second emission area.

The first emission area may emit red light or blue light, and the second emission area may emit green light.

According to one or more embodiments, a display apparatus may include a driving voltage line disposed on a substrate and extending in a first direction, a data line extending in the first direction and apart from the driving voltage line, a first sub-pixel electrode overlapping the data line in a plan view, a second sub-pixel electrode overlapping the driving voltage line in a plan view, a bank layer overlapping edges of the first and second sub-pixel electrodes, a first opening corresponding to a portion of the first sub-pixel electrode and defined in the bank layer, a second opening corresponding to a portion of the second sub-pixel electrode and defined in the bank layer, a first emission layer corresponding to the first opening, disposed on the bank layer, a second emission layer corresponding to the second opening, disposed on the bank layer, and an opposite electrode on the first emission layer and the second emission layer, wherein the second opening of the bank layer is disposed inside an edge of the driving voltage line.

The driving voltage line may include a plurality of main portions, and a plurality of sub-portions extending in the first direction and connecting the plurality of main portions, the first opening may overlap at least one sub-portion of the plurality of sub-portions in a plan view, and the second opening may overlap one main portion of the plurality of main portions in a plan view.

Each of the main portions of the driving voltage line may include a first edge and a second edge, which are disposed opposite to each other with the second opening therebetween and which extend in the first direction, and in a plan view, a shortest distance from the third edge to the second opening may be equal to a shortest distance from the fourth edge to the second opening.

Each of the main portions of the driving voltage line may include a third edge and a fourth edge, which are disposed opposite to each other with the second opening therebetween and extend in a second direction perpendicular to the first direction, and in a plan view, a shortest distance from the third edge to the second opening may be equal to a shortest distance from the fourth edge to the second opening.

The display apparatus may further include a lower conductive layer disposed under the driving voltage line, and a first insulating layer disposed between the driving voltage line and the lower conductive layer, wherein a plurality of holes through which the driving voltage line and the lower conductive layer contact each other may be defined in the first insulating layer.

The plurality of holes may include a first hole and a second hole, which overlap one first opening in a plan view, and the first hole and the second hole may be disposed on an imaginary straight line passing, in the first direction, through a center of the first opening.

The first hole and the second hole may be arranged to be symmetrical to each other with respect to an imaginary straight line passing, in a second direction perpendicular to the first direction, through the center of the first opening.

The first opening may have a shape symmetrical with respect to an imaginary straight line passing, in the first direction, through a center of the first opening, and the first opening may have a shape symmetrical with respect to an imaginary straight line passing, in a second direction perpendicular to the first direction, through the center of the first opening.

The second opening may have a shape symmetrical with respect to an imaginary straight line passing, in a direction intersecting the first direction and a second direction perpendicular to the first direction, through a center of the second opening.

The first emission layer may emit red light or blue light, and the second emission layer may emit green light.

BRIEF DESCRIPTION OF THE DRAWINGS

The above and other aspects, features, and advantages of certain embodiments of the disclosure will be more apparent from the following description taken in conjunction with the accompanying drawings, in which.

DETAILED DESCRIPTION OF THE EMBODIMENTS

Figure 1:
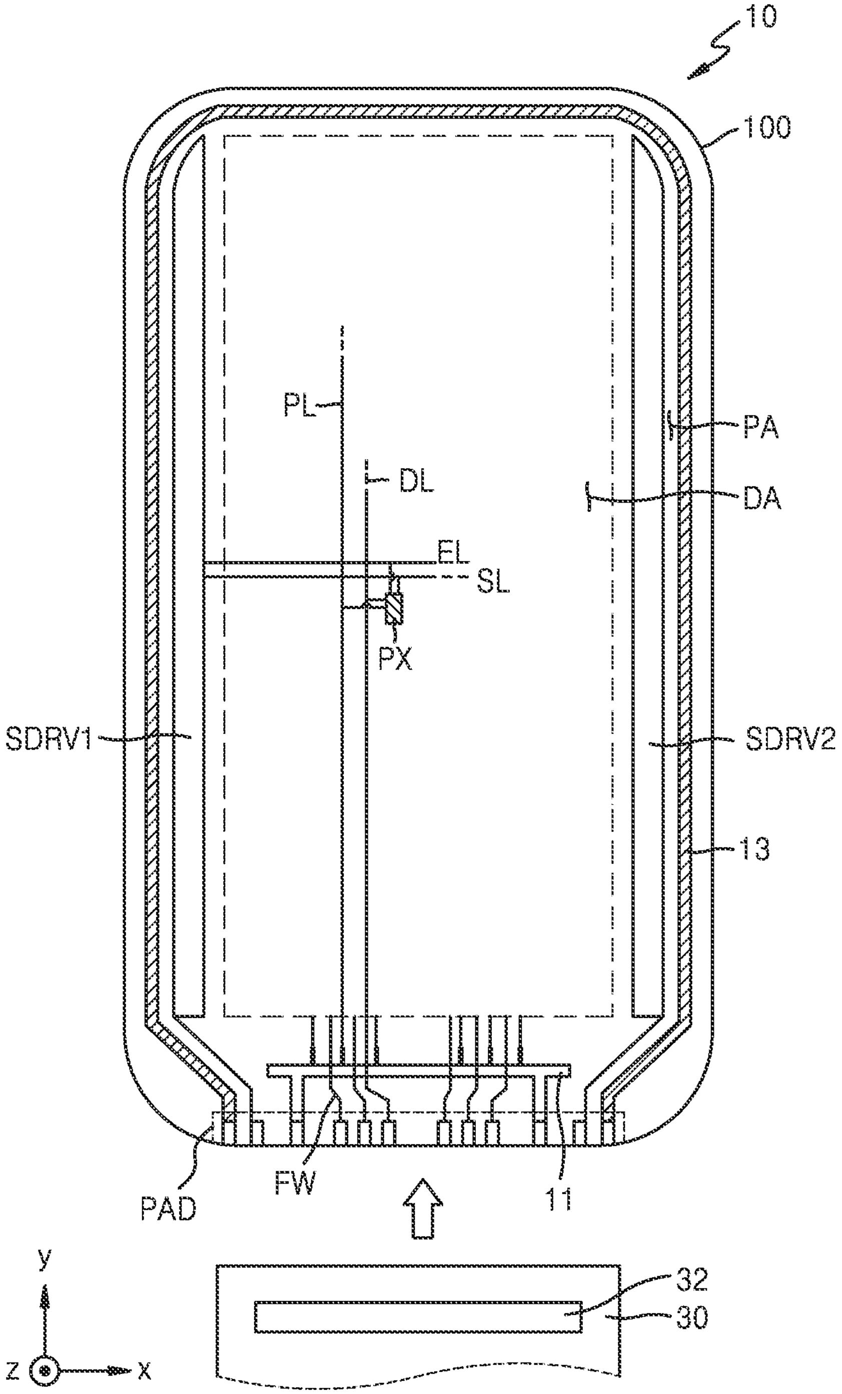
FIG. 1 is a schematic plan view of a display panel according to an embodiment.

Reference will now be made in detail to embodiments, examples of which are illustrated in the accompanying drawings, wherein like reference numerals refer to like elements throughout. In this regard, the embodiments may have different forms and should not be construed as being limited to the descriptions set forth herein. Accordingly, the embodiments are merely described below, by referring to the figures, to explain aspects of the description. Like reference numerals are used for like or corresponding elements.

As used herein, the term "and/or" includes any and all combinations of one or more of the associated listed items. For example, "A and/or B" may be understood to mean any combination including "A, B, or A and B." The terms "and" and "or" may be used in the conjunctive or disjunctive sense and may be understood to be equivalent to "and/or."

For the purposes of this disclosure, the phrase "at least one of A and B" may be construed as A only, B only, or any combination of A and B. Also, "at least one of X, Y, and Z" and "at least one selected from the group consisting of X, Y, and Z" may be construed as X only, Y only, Z only, or any combination of two or more of X, Y, and Z.

It will be understood that the terms "connected to" or "coupled to" may include a physical and/or electrical connection or coupling. Similarly, a contact may include a physical contact and/or an electrical contact.

It will be understood that although the terms "first," "second," etc. may be used herein to describe various components, these components should not be limited by these terms. These terms are only used to distinguish one component from another.

As used herein, the singular forms are intended to include the plural forms as well, unless the context clearly indicates otherwise.

It will be further understood that the terms "include", "comprise", and/or "have" used herein specify the presence of stated features or components, but do not preclude the presence or addition of one or more other features or components.

It will be understood that when a layer, region, or component is referred to as being "formed on" another layer, region, or component, it can be directly or indirectly formed on the other layer, region, or component. For example, for example, intervening layers, regions, or components may be present.

As used herein, when a wiring is referred to as "extending in a first direction or a second direction," it may mean that the wiring not only extends in a straight line shape but also may mean that the wiring extends in a zigzag or in a curve in the first direction or the second direction.

As used herein, "in a plan view" means that an objective portion is viewed from above, and "in a cross-sectional view" means that a cross-section of an objective portion taken vertically is viewed from a lateral side. As used herein, "overlapping" includes overlapping "in a plan view" and/or "in a cross-sectional view."

The term "overlap" or "overlapped" mean that a first object may be above or below of a second object, and vice versa. Additionally, the term "overlap" may include layer, stack, face or facing, extending over, covering, or partly covering or any other suitable term as would be appreciated and understood by those of ordinary skill in the art.

Unless otherwise defined or implied herein, all terms (including technical and scientific terms) used herein have the same meaning as commonly understood by one of ordinary skill in the art to which the disclosure pertains. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

FIG. 1 is a schematic plan view of a display panel 10 according to an embodiment.

Referring to FIG. 1, a display apparatus according to an embodiment may include the display panel 10. The display panel 10 may include a display area DA and a peripheral area PA. Various components constituting the display panel 10 are disposed on a substrate 100. In other words, the substrate 100 may include the display area DA and the peripheral area PA.

When viewing the display area DA in plan view, the display area DA may have a rectangular shape, as shown in FIG. 1. In another embodiment, the display area DA may have a polygonal shape, such as a triangle, pentagon, or hexagon, a circular shape, an elliptical shape, or an atypical shape. An edge corner of the display area DA may have a round shape. The peripheral area PA may be a type of non-display area in which display elements are not disposed. The display area DA may be entirely surrounded by the peripheral area PA.

Multiple sub-pixels PXs having various display elements, such as organic light-emitting diodes may be arranged in the display area DA. The sub-pixels PX may be arranged in various forms, such as a stripe arrangement, a PenTile® arrangement, and/or a mosaic arrangement, in the x direction and the y direction to implement an image. Each of the sub-pixels PX may emit, for example, red, green, blue, or white light.

Each of the sub-pixel circuits driving the sub-pixels PX may be electrically connected to outer circuits arranged in the peripheral area PA. A first scan driving circuit SDRV1, a second scan driving circuit SDRV2, a terminal portion PAD, a driving voltage supply line 11, and a common voltage supply line 13 may be arranged in the peripheral area PA.

The first scan driving circuit SDRV1 may apply a scan signal to each of the sub-pixel circuits driving the sub-pixels PX through a scan line SL. The first scan driving circuit SDRV1 may apply an emission control signal to each sub-pixel circuit through an emission control line EL. The second scan driving circuit SDRV2 may be located on the opposite side of the first scan driving circuit SDRV1 with respect to the display area DA, and may be substantially parallel to the first scan driving circuit SDRV1. Some of the sub-pixel circuits driving the sub-pixels PX of the display area DA may be electrically connected to the first scan driving circuit SDRV1, and the remaining sub-pixel circuits may be electrically connected to the second scan driving circuit SDRV2. The second scan driving circuit SDRV2 may be omitted.

The terminal portion PAD may be disposed on a side of the substrate 100. The terminal portion PAD may be exposed and connected to a display circuit board 30 without being covered by an insulating layer. A display driver 32 may be disposed on the display circuit board 30.

The display driver 32 may generate a control signal transmitted to the first scan driving circuit SDRV1 and the second scan driving circuit SDRV2. The display driver 32 may generate a data signal, and the generated data signal may be transmitted to the sub-pixel circuits of the sub-pixels PX through a fan-out line FW and a data line DL connected to the fan-out line FW.

The display driver 32 may supply a driving voltage ELVDD to the driving voltage supply line 11 and may supply a common voltage ELVSS to the common voltage supply line 13. The driving voltage ELVDD may be applied to the sub-pixel circuits of the sub-pixels PX through a driving voltage line PL connected to the driving voltage supply line 11, and the common voltage ELVSS may be applied to an opposite electrode of a display element through the common voltage supply line 13.

The driving voltage supply line 11 may be connected to the terminal portion PAD and may extend in the x direction from a lower side of the display area DA. The common voltage supply line 13 may be connected to the terminal portion PAD and may have a loop shape with one side open to partially surround the display area DA.

The display apparatus may further include a cover window (not shown). The cover window may be disposed on the display panel 10. The cover window may protect the display panel 10. In an embodiment, the cover window may be a flexible window. The cover window may include glass, sapphire, and/or plastic. The cover window may include, for example, ultra thin glass or colorless polyimide. The cover window may be attached to the display panel 10 by a transparent adhesive member, such as an optically clear adhesive (OCA) film.

The display apparatus according to an embodiment may be implemented as an electronic device, such as a smart phone, a mobile phone, a navigation device, a game machine, a TV, a vehicle head unit, a notebook computer, a laptop computer, a tablet computer, a personal media player (PMP), or a personal digital assistant (PDA). The electronic device may be a flexible device.

Figure 2:
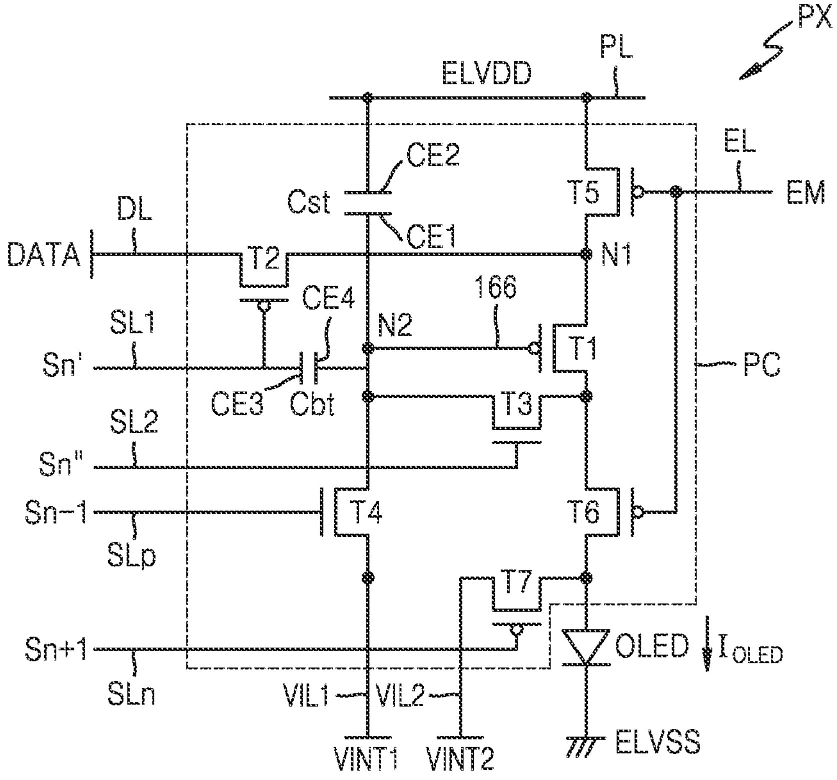
FIG. 2 is a schematic view of an equivalent circuit of a sub-pixel that may be included in a display apparatus according to an embodiment.

FIG. 2 is a schematic view of an equivalent circuit of a sub-pixel PX that may be included in a display apparatus according to an embodiment.

Referring to FIG. 2, a sub-pixel circuit PC of the sub-pixel PX may include multiple thin-film transistors T1 to T7, a first capacitor Cst, a second capacitor Cbt, and an organic light-emitting diode OLED as a display element.

In an embodiment, the thin-film transistors T1 to T7 may include a driving transistor T1, a switching transistor T2, a compensation transistor T3, a first initialization transistor T4, an operation control transistor T5, an emission control transistor T6, and a second initialization transistor T7. However, the disclosure is not limited thereto.

The organic light-emitting diode OLED may include a sub-pixel electrode and an opposite electrode. The sub-pixel electrode of the organic light-emitting diode OLED may be connected to the driving transistor T1 via the emission control transistor T6 to receive a driving current, and the opposite electrode may be provided with a common voltage ELVSS. The organic light-emitting diode OLED may generate light having luminance corresponding to the driving current.

Some of the thin-film transistors T1 to T7 may be n-channel MOSFET (NMOS) transistors, and the rest of the thin-film transistors T1 to T7 may be p-channel MOSFET (PMOS) transistors. For example, as shown in FIG. 2, among the thin-film transistors T1 to T7, a compensation transistor T3 and a first initialization transistor T4 may be NMOS transistors, and the rest of the thin-film transistors T1 to T7, may be PMOS transistors. In other embodiments, among the thin-film transistors T1 to T7, the compensation transistor T3, the first initialization transistor T4, and a second initialization transistor T7 may be NMOS transistors, and the rest of the thin-film transistors T1 to T7 may be PMOS transistors. In other embodiments, all of the thin-film transistors T1 to T7 may be NMOS transistors. In other embodiments, all of the thin-film transistors T1 to T7 may be PMOS transistors.

Signal lines may include a first scan line SL1 configured to transmit a first scan signal Sn' to the switching transistor T2, a second scan line SL2 configured to transmit a second scan signal Sn" to the compensation transistor T3, a previous scan line SLp configured to transmit a previous scan signal Sn−1 to the first initialization transistor T4, an emission control line EL configured to transmit an emission control signal EM to an operation control transistor T5 and an emission control transistor T6, a subsequent scan line SLn configured to transmit a subsequent scan signal Sn+1 to the second initialization transistor T7, and a data line DL configured to transmit a data signal DATA to the switching transistor T2. However, the disclosure is not limited thereto.

A driving transistor T1 may be connected to a driving voltage line PL via the operation control transistor T5 and may be electrically connected to the organic light-emitting diode OLED via the emission control transistor T6. The driving transistor T1 may be configured to receive the data signal DATA according to a switching operation of a switching transistor T2 and supply a driving current $I_{OLED}$ to the organic light-emitting diode OLED.

The switching transistor T2 may be connected to the first scan line SL1 and the data line DL and may be connected to the driving voltage line PL via the operation control transistor T5. The switching transistor T2 may be configured to be turned on according to the first scan signal Sn' received through the first scan line SL1 and transfer the data signal DATA, which is transmitted through the data line DL, to the first node N1.

The compensation transistor T3 may be connected to the second scan line SL2 and may be connected to the organic light-emitting diode OLED via the emission control transistor T6. The compensation transistor T3 may be configured to be turned on according to the second scan signal Sn" received through the second scan line SL2 and diode-connect the driving transistor T1 to thereby compensate the threshold voltage of the driving transistor T1.

The first initialization transistor T4 may be connected to the previous scan line SLp and the first initialization voltage line VIL1, and may be configured to be turned on according to the previous scan signal Sn−1 received through the previous scan line SLp and transfer a first initialization voltage VINT1 from the first initialization voltage line VIL1 to a gate electrode of the driving transistor T1 to initialize the voltage of the gate electrode of the driving transistor T1.

The operation control transistor T5 and the emission control transistor T6 may be connected to the emission control line EL, and may be configured to be simultaneously turned on according to the emission control signal EM received through the emission control line EL and form a current path so that a driving current $I_{OLED}$ may flow from the driving voltage line PL to the organic light-emitting diode OLED.

The second initialization transistor T7 may be connected to the subsequent scan line SLn and the second initialization voltage line VIL2, and may be configured to be turned on according to the subsequent scan signal Sn+1 received through the subsequent scan line SLn and transfer a second initialization voltage VINT2 from the second initialization voltage line VIL2 to the organic light-emitting diode OLED to initialize the organic light-emitting diode OLED. The second initialization transistor T7 may be omitted.

The first capacitor Cst may include a first capacitor electrode CE1 and a second capacitor electrode CE2. The first capacitor electrode CE1 may be connected to the gate electrode of the driving transistor T1, and the second capacitor electrode CE2 may be connected to the driving voltage line PL. The first capacitor Cst may maintain a voltage applied to the gate electrode of the driving transistor T1 by storing and maintaining a voltage corresponding to a voltage difference between the driving voltage line PL and the gate electrode of the driving transistor T1.

The second capacitor Cbt may include a third capacitor electrode CE3 and a fourth capacitor electrode CE4. The third capacitor electrode CE3 may be connected to the first scan line SL1 and a gate electrode of the switching transistor T2. The fourth capacitor electrode CE4 may be connected to the gate electrode of the driving transistor T1 and the first capacitor electrode CE1 of the first capacitor Cst. The second capacitor Cbt may be a boosting capacitor, and in case that the first scan signal Sn of the first scan line SL1 has a voltage for turning off the switching transistor T2, the second capacitor Cbt may increase the voltage of the second node N2 to clearly express a black gradation.

Detailed operations of the sub-pixel circuit PC and the organic light-emitting diode OLED, which is a display element, according to an embodiment are described below.

During an initialization period, in case that a previous scan signal Sn−1 is supplied through the previous scan line SLp, the first initialization transistor T4 may be turned on according to the previous scan signal Sn−1, and the driving transistor T1 may be initialized by the initialization voltage VINT supplied from the first initialization voltage line VIL1.

During a data programming period, in case that a first scan signal Sn is supplied through the first scan line SL1, the switching transistor T2 and the compensation transistor T3 may be turned on in response to the first scan signal Sn. The driving transistor T1 may be diode-connected and forward-biased by the compensation transistor T3 that is turned on. A compensation voltage (DATA+Vth (Vth has a (−) value)) may be applied to the driving gate electrode of the driving transistor T1, wherein the compensation voltage (DATA+Vth) is obtained by subtracting a threshold voltage Vth of the driving transistor T1 from a data signal DATA supplied from the data line DL. The driving voltage ELVDD and the compensation voltage (DATA+Vth) may be respectively applied to two opposite ends of the first capacitor Cst, and charge corresponding to a difference between voltages of the two opposite ends may be stored in the first capacitor Cst.

During an emission period, the operation control transistor T5 and the emission control transistor T6 may be turned on according to an emission control signal En supplied from the emission control line EL. The driving current $I_{OLED}$ corresponding to a voltage difference between the voltage of the driving gate electrode of the driving transistor T1 and the driving voltage ELVDD may be generated, and the driving current $I_{OLED}$ may be supplied to the organic light-emitting diode OLED through the emission control transistor T6.

In an embodiment, at least one of the thin-film transistors T1 to T7 may include a semiconductor layer including oxide, and the rest of the thin-film transistors T1 to T7 may include a semiconductor layer including amorphous silicon or polycrystalline silicon.

Specifically, the driving transistor T1 that directly affects the brightness of the display apparatus may include a semiconductor layer including polycrystalline silicon having high reliability, thereby realizing a high-resolution display apparatus.

Because an oxide semiconductor has high carrier mobility and low leakage current, a voltage drop may not be large even though a driving time is long. For example, because a color change of an image according to a voltage drop is not large even during low-frequency driving, low-frequency driving may be possible.

As described above, because an oxide semiconductor has an advantage of a small leakage current, at least one of the compensation transistor T3 and the first initialization transistor T4 connected to the gate electrode of the driving transistor T1 may employ an oxide semiconductor to thereby prevent leakage current flowing to the gate electrode of the driving transistor T1 and reduce power consumption.

The sub-pixel circuit PC is not limited to the number and circuit design of thin-film transistors and capacitors described with reference to FIG. 2, and the number and circuit design may be variously changed.

Figure 3:
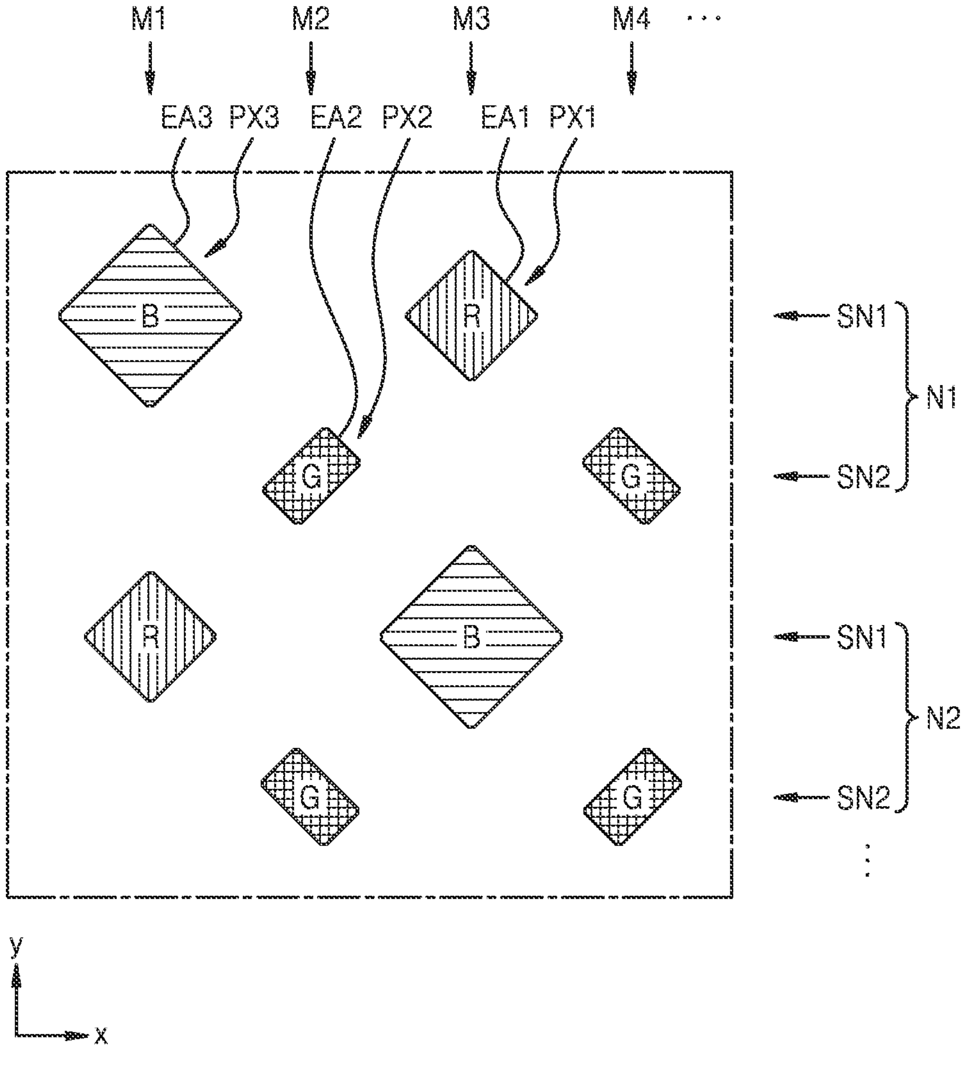
FIG. 3 is a schematic plan view illustrating emission areas of multiple sub-pixels according to an embodiment.

FIG. 3 is a schematic plan view illustrating emission areas of multiple sub-pixels according to an embodiment.

Referring to FIG. 3, the sub-pixels arranged in the display area DA may include a first sub-pixel PX1, a second sub-pixel PX2, and a third sub-pixel PX3. The first sub-pixel PX1, the second sub-pixel PX2, and the third sub-pixel PX3 may be repeatedly arranged according to a certain pattern in the x direction and the y direction. The first sub-pixel PX1, the second sub-pixel PX2, and the third sub-pixel PX3 may each include a sub-pixel circuit and an organic light-emitting diode (i.e., the organic light-emitting diode OLED) electrically connected to the sub-pixel circuit. The organic light-emitting diode of each sub-pixel may be disposed on an upper layer of the sub-pixel circuit. The organic light-emitting diode may be disposed directly above the sub-pixel circuit to overlap the sub-pixel circuit, or may be disposed to be offset from the sub-pixel circuit and partially overlap a sub-pixel circuit of another sub-pixel disposed in an adjacent row or column.

FIG. 3 shows an emission area of each of the first sub-pixel PX1, the second sub-pixel PX2, and the third sub-pixel PX3. The emission area is an area where an emission layer of the organic light-emitting diode is disposed. The emission area may be defined by an opening of a bank layer. This is described below.

The first sub-pixel PX1 may include a first emission area EA1, the second sub-pixel PX2 may include a second emission area EA2, and the third sub-pixel PX3 may include a third emission area EA3.

In odd-numbered columns (or even-numbered columns), the first emission area EA1 of the first sub-pixel PX1 and the third emission area EA3 of the third sub-pixel PX3 may be alternately arranged in the y direction. In even-numbered columns (or odd-numbered columns), the second emission area EA2 of the second sub-pixel PX2 may be repeatedly arranged in the y direction. For example, in a first column M1, the first emission area EA1 of the first sub-pixel PX1 and the third emission area EA3 of the third sub-pixel PX3 may be alternately arranged in the y direction. In a second column M2 adjacent to the first column M1, the second emission area EA2 of the second sub-pixel PX2 may be repeatedly arranged in the y direction. In a third column M3 adjacent to the second column M2, the third emission area EA3 of the third sub-pixel PX3 and the first emission area EA1 of the first sub-pixel PX1 may be alternately arranged in the y direction in an opposite way to that in the first column M1.

In a first sub-row SN1 of each row N1, N2, . . . , the first emission area EA1 of the first sub-pixel PX1 and the third emission area EA3 of the third sub-pixel PX3 may be alternately arranged in the x direction, and in a second sub-row SN2 of each row N1, N2, . . . , the second emission area EA2 of the second sub-pixel PX2 may be repeatedly arranged in the x direction. In other words, in each row N1, N2, . . . , the first emission area EA1 of the first sub-pixel PX1, the second emission area EA2 of the second sub-pixel PX2, the third emission area EA3 of the third sub-pixel PX3, and the second emission area EA2 of the second sub-pixels PX2 may be repeatedly arranged in a zigzag pattern.

The first emission area EA1 of the first sub-pixel PX1, the second emission area EA2 of the second sub-pixel PX2, and the third emission area EA3 of the third sub-pixel PX3 may have different areas. In an embodiment, the third emission area EA3 of the third sub-pixel PX3 may have an area that is greater than that of the first emission area EA1 of the first sub-pixel PX1. The third emission area EA3 of the third sub-pixel PX3 may have an area that is greater than that of the second emission area EA2 of the second sub-pixel PX2. The first emission area EA1 of the first sub-pixel PX1 may have an area that is greater than that of the second emission area EA2 of the second sub-pixel PX2. In another embodiment, the third emission area EA3 of the third sub-pixel PX3 may have an area that is equal to that of the first emission area EA1 of the first sub-pixel PX1. The disclosure is not limited thereto. In other words, several embodiments may be made. For example, the first emission area EA1 of the first sub-pixel PX1 may be larger than the second emission area EA2 of the second sub-pixel PX2 and the third emission area EA3 of the third sub-pixel PX3.

Each of the first to third emission areas EA1, EA2, and EA3 may have a polygonal shape, such as a quadrangle or an octagon, a circular shape, or an elliptical shape. Here, the polygonal shape may also include a shape with round corners (vertexes).

In an embodiment, the first sub-pixel PX1 may be a red sub-pixel R emitting red light, the second sub-pixel PX2 may be a green sub-pixel G emitting green light, and the third sub-pixel PX3 may be a blue sub-pixel B emitting blue light. In another embodiment, the first sub-pixel PX1 may be a red sub-pixel R, the second sub-pixel PX2 may be a green sub-pixel G, and the third sub-pixel PX3 may be a blue sub-pixel B.

In an embodiment, a sub-pixel arrangement may be understood as an arrangement of emission areas. In other words, the sub-pixel arrangement shown in FIG. 2 may be a PenTile® arrangement, for example, a diamond PenTile® arrangement. However, the sub-pixel arrangement according to the embodiment is not limited to the above arrangement. For example, the disclosure may be applied to a sub-pixel arrangement having a strip arrangement, a mosaic arrangement, or a delta arrangement. The disclosure may be applied to a sub-pixel arrangement structure further including white sub-pixels emitting white light.

Figure 4:
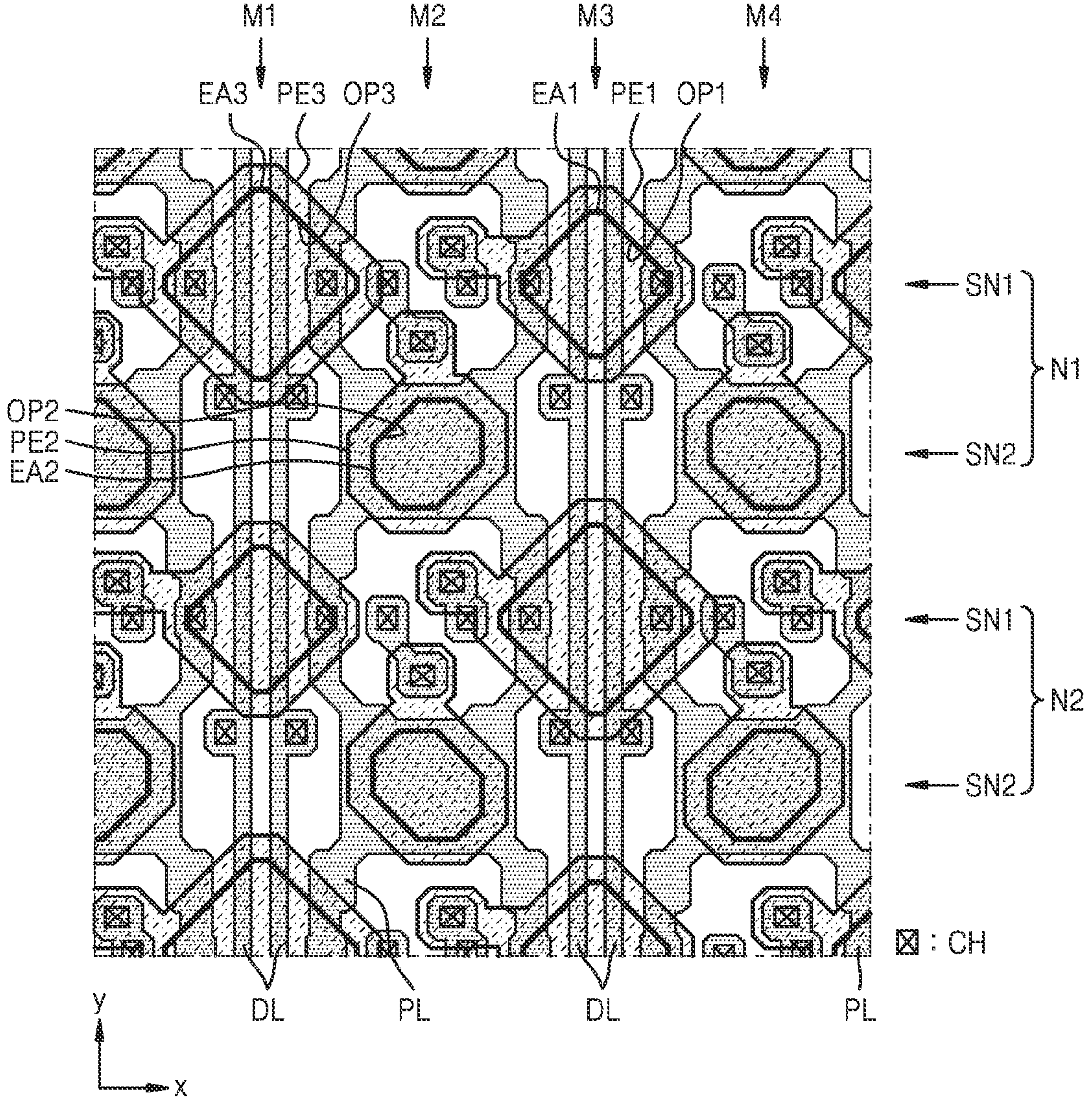
FIG. 4 is a schematic plan view illustrating a portion of a display apparatus according to an embodiment.

FIG. 4 is a schematic plan view illustrating a portion of a display apparatus according to an embodiment.

Referring to FIG. 4, data lines DL and driving voltage lines PL may be arranged in the display area DA of the substrate 100. Each of the data lines DL may extend in the y direction. Each of the driving voltage lines PL may extend in the y direction. In an embodiment, the data line DL and the driving voltage line PL may be disposed on the same layer and be apart from each other. In an embodiment, the data line DL may be disposed between two adjacent driving voltage lines PL.

First to third sub-pixel electrodes PE1, PE2, and PE3 of first to third sub-pixels may be disposed above the data line DL and the driving voltage line PL.

The first sub-pixel electrode PE1 of the first sub-pixel and the third sub-pixel electrode PE3 of the third sub-pixel may be alternately arranged in the x direction and the y direction. The first sub-pixel electrode PE1 of the first sub-pixel and the third sub-pixel electrode PE3 of the third sub-pixel may be alternately arranged in the y direction in odd-numbered columns M1, M3, . . . , and may be alternately arranged in the x direction in a first sub-row SN1 of each row N1, N2, . . . . The second sub-pixel electrode PE2 of the second sub-pixel may be apart from the first sub-pixel electrode PE1 and the third sub-pixel electrode PE3 in a diagonal direction, and may be repeatedly disposed in the x direction and the y direction. The second sub-pixel electrode PE2 of the second sub-pixel may be repeatedly arranged in the y direction in even-numbered columns M2, M4, . . . , and may be repeatedly arranged in the x direction in a second sub-row SN2 of each row N1, N2, . . . .

Each of the first to third emission areas EA1, EA2, and EA3 of the first to third sub-pixels may correspond to a portion of each of the first to third sub-pixel electrodes PE1, PE2, and PE3. The first to third emission areas EA1, EA2, and EA3 may be defined by first to third openings OP1, OP2, and OP3 defined in a bank layer PDL.

Each of the first to third emission areas EA1, EA2, and EA3 may be vertically symmetrical and horizontally symmetrical with respect to the center point of the emission area. For example, each of the first emission area EA1 and the third emission area EA3 may be vertically symmetrical with respect to an imaginary straight line in the x direction passing through the center point of the emission area, and may be horizontally symmetrical with respect to an imaginary straight line in the y direction passing through the center point of the emission area.

The second emission area EA2 may be vertically symmetrical and horizontally symmetrical with respect to an imaginary straight line passing through the center point of the emission area and in a direction that intersects the x-direction and the y-direction. For example, the second emission area EA2 may be vertically symmetrical with respect to an imaginary straight line in a diagonal direction (a direction inclined from the +y direction to the +x direction) passing through the center point of the emission area, and may be horizontally symmetrical with respect to an imaginary straight line in a diagonal direction (a direction inclined from the +y direction to the −x direction) passing through the center point of the emission area.

Each of the data line DL and the driving voltage line PL may be disposed to at least partially overlap emission areas of sub-pixels in a plan view. For example, the data line DL extending along the first column M1 may overlap the first emission area EA1 of the first sub-pixel and the third emission area EA3 of the third sub-pixel, which are alternately arranged. The driving voltage line PL extending along the second column M2 may overlap the second emission area EA2 of the second sub-pixel.

Figure 5:
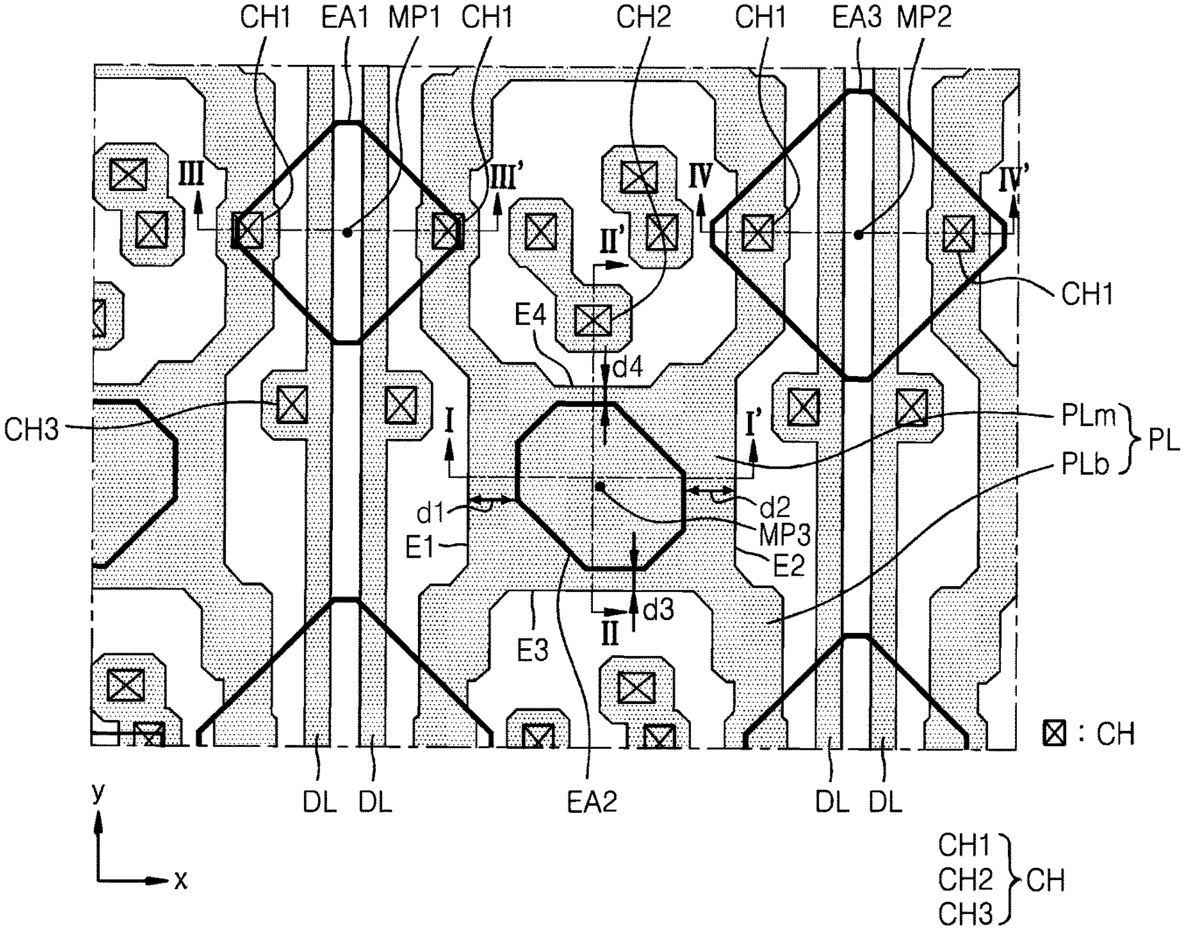
FIG. 5 is an enlarged schematic plan view of a portion of the display apparatus shown in FIG. 4.
Figure 6:
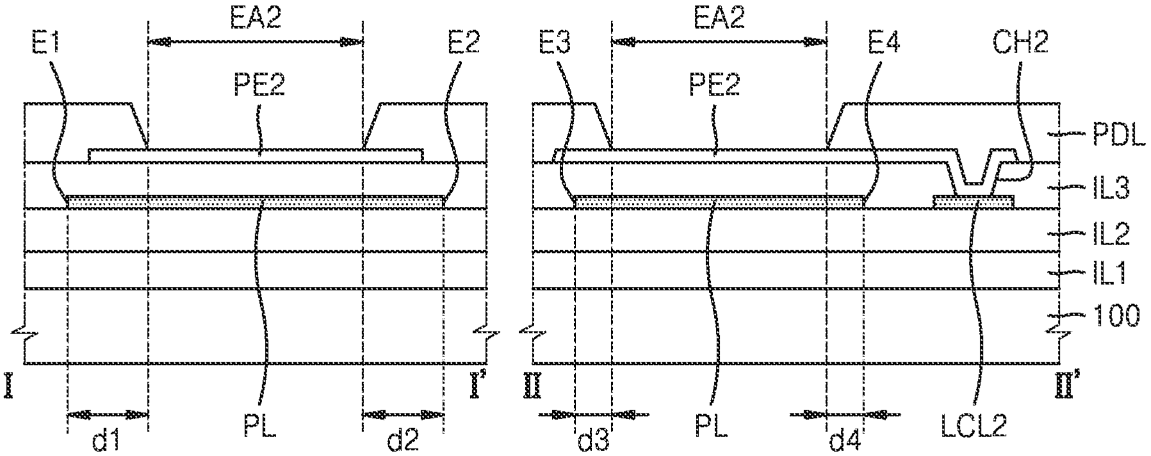
FIG. 6 is a schematic view illustrating cross-sections taken along line I-I' and line II-II' in FIG. 5.
Figure 7:
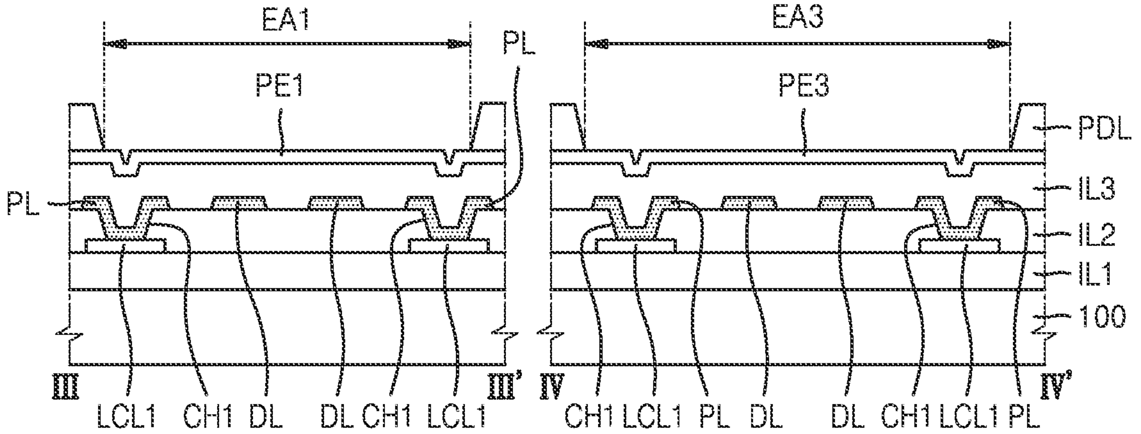
FIG. 7 is a schematic view illustrating cross-sections taken along line III-III' and line IV-IV' in FIG. 5.

FIG. 5 is an enlarged schematic plan view of a portion of the display apparatus shown in FIG. 4, FIG. 6 is a schematic view illustrating cross-sections taken along line I-I' and line II-II' in FIG. 5, and FIG. 7 is a schematic view illustrating cross-sections taken along line III-III' and line IV-IV' in FIG. 5.

Referring to FIG. 5, each of the driving voltage lines PL may extend in the y direction and may include main portions PLm and sub-portions PLb. The main portions PLm of each of the driving voltage lines PL may be apart from each other at certain intervals in the y direction. Each of the main portions PLm may be connected to the sub-portions PLb extending in the y direction. Each of the data lines DL may extend in the y direction and may be disposed between two adjacent driving voltage lines PL. For example, two data lines DL may be disposed between two adjacent driving voltage lines PL.

The first emission area EA1 of the first sub-pixel and the third emission area EA3 of the third sub-pixel may overlap the sub-portion PLb of the driving voltage line PL. The second emission area EA2 of the second sub-pixel may overlap the main portion PLm of the driving voltage line PL.

Referring to FIGS. 5 and 6, the second emission area EA2 of the second sub-pixel may entirely overlap the main portion PLm of the driving voltage line PL. The second emission area EA2 may be disposed inside the edge of the main portion PLm of the driving voltage line PL. For example, the main portion PLm of the driving voltage line PL may have a first edge E1 and a second edge E2, which are disposed opposite to each other with the second emission area EA2 therebetween, and a third edge E3 and a fourth edge E4, which are disposed opposite to each other with the second emission area EA2 therebetween. The first edge E1 and the second edge E2 may be edges extending in the y direction, and the third edge E3 and the fourth edge E4 may be edges extending in the x direction.

In a plan view, the shortest distance d1 from the first edge E1 of the driving voltage line PL to the second emission area EA2 may be substantially equal to the shortest distance d2 from the second edge E2 of the driving voltage line PL to the second emission area EA2. The shortest distance d3 from the third edge E3 of the driving voltage line PL to the second emission area EA2 may be substantially equal to the shortest distance d4 from the fourth edge E4 of the driving voltage line PL to the second emission area EA2. In other words, the main portion PLm of the driving voltage line PL may equally extend from the second emission area EA2 in a vertical direction or a left and right direction.

Referring to FIGS. 5 and 7, the first emission area EA1 of the first sub-pixel and the third emission area EA3 of the third sub-pixel may overlap the data line DL. In an embodiment, each of the first emission area EA1 and the third emission area EA3 may overlap multiple data lines DL. Each of the data lines DL overlapping one first emission area EA1 or one third emission area EA3 may be vertically symmetrical and horizontally symmetrical with respect to the center point of the first emission area EA1 or the third emission area EA3.

For example, multiple data lines DL overlapping one first emission area EA1 may be vertically symmetrical with respect to an imaginary straight line in the x direction passing through the center point MP1 of the first emission area EA1. The data lines DL overlapping one first emission area EA1 may be horizontally symmetrical with respect to an imaginary straight line in the y direction passing through the center point MP1 of the first emission area EA1. Multiple data lines DL overlapping one third emission area EA3 may be vertically symmetrical with respect to an imaginary straight line in the x direction passing through the center point MP3 of the third emission area EA3. The data lines DL overlapping one third emission area EA3 may be horizontally symmetrical with respect to an imaginary straight line in the y direction passing through the center point MP3 of the third emission area EA3.

The driving voltage line PL (e.g., the sub-portion PLb of the driving voltage line PL) may contact a first conductive layer LCL1 through each of the first contact holes CH1. The first contact holes CH1 may be defined in an insulating layer IL2 between the driving voltage line PL and the first conductive layer LCL1. Although not shown in the drawings, circuit elements constituting a sub-pixel circuit may be arranged in a multi-layer insulating layer IL1 between the substrate 100 and the first conductive layer LCL1. The first conductive layer LCL1 may contact one component of the sub-pixel circuit.

The first contact holes CH1 may overlap the first emission areas EA1 of the first sub-pixels and the third emission areas EA3 of the third sub-pixels. In an embodiment, each of the first emission area EA1 and the third emission area EA3 may overlap multiple first contact holes CH1. First contact holes CH1 overlapping one first emission area EA1 may be arranged to be vertically and horizontally symmetrical with respect to the center point MP1 of the first emission area EA1. For example, the first contact holes CH1 (e.g., the centers of the first contact holes CH1) overlapping one first emission area EA1 may be disposed on an imaginary straight line in the x direction passing through the center point MP1 of the first emission area EA1, and may be vertically symmetrical with respect to the imaginary straight line. The first contact holes CH1 overlapping one first emission area EA1 may be arranged to be horizontally symmetrical with respect to an imaginary straight line in the y direction passing through the center point of the first emission area EA1.

Similarly, first contact holes CH1 overlapping one third emission area EA3 may be arranged to be vertically and horizontally symmetrical with respect to the center point MP3 of the third emission area EA3. For example, the first contact holes CH1 overlapping one third emission area EA3 (e.g., the centers of the first contact holes CH1) may be disposed on an imaginary straight line in the x direction passing through the center point MP3 of the third emission area EA3, and may be vertically symmetrical with respect to the imaginary straight line. The first contact holes CH1 overlapping one third emission area EA3 may be arranged to be horizontally symmetrical with respect to an imaginary straight line in the y direction passing through the center point MP3 of the third emission area EA3.

The first to third sub-pixel electrodes PE1, PE2, and PE3 of the first to third sub-pixels may contact a second conductive layer LCL2 through respective second contact holes CH2. The second contact holes CH2 may be defined in an insulating layer IL3 between the first to third sub-pixel electrodes PE1, PE2, and PE3 and the second conductive layer LCL2. The second conductive layer LCL2 may contact one component of the sub-pixel circuit. In an embodiment, the second conductive layer LCL2 may be disposed on the same layer as the data line DL and/or the driving voltage line PL. In an embodiment, the second contact holes CH2 may be arranged in a separation space between the main portions PLm arranged in the driving voltage line PL in the y direction.

The data line DL may contact a third conductive layer (not shown) through each of the third contact holes CH3. Although not shown in the drawings, the third contact holes CH3 may be defined in the insulating layer IL2 between the data line DL and the third conductive layer.

The third conductive layer may contact one component of the sub-pixel circuit. In an embodiment, the third contact holes CH3 may be disposed outside the first and third emission areas EA1 and EA3. In other words, the third contact holes CH3 may not overlap the first emission area EA1 and the third emission area EA3.

In the first emission area EA1 and the third emission area EA3, the first contact holes CH1 and the data lines DL, which overlap each emission area, may be vertically symmetrical and horizontally symmetrical with respect to the center point of each emission area. Vertical and horizontal step characteristics of each of the first emission area EA1 and the third emission area EA3 may be the same. The second emission area EA2 may entirely overlap the driving voltage line PL and may be disposed inside the edge of the driving voltage line PL. Vertical and horizontal step characteristics of the second emission area EA2 may be the same. Accordingly, an asymmetric color shift between sub-pixels according to a viewing angle may be reduced.

Figure 8:
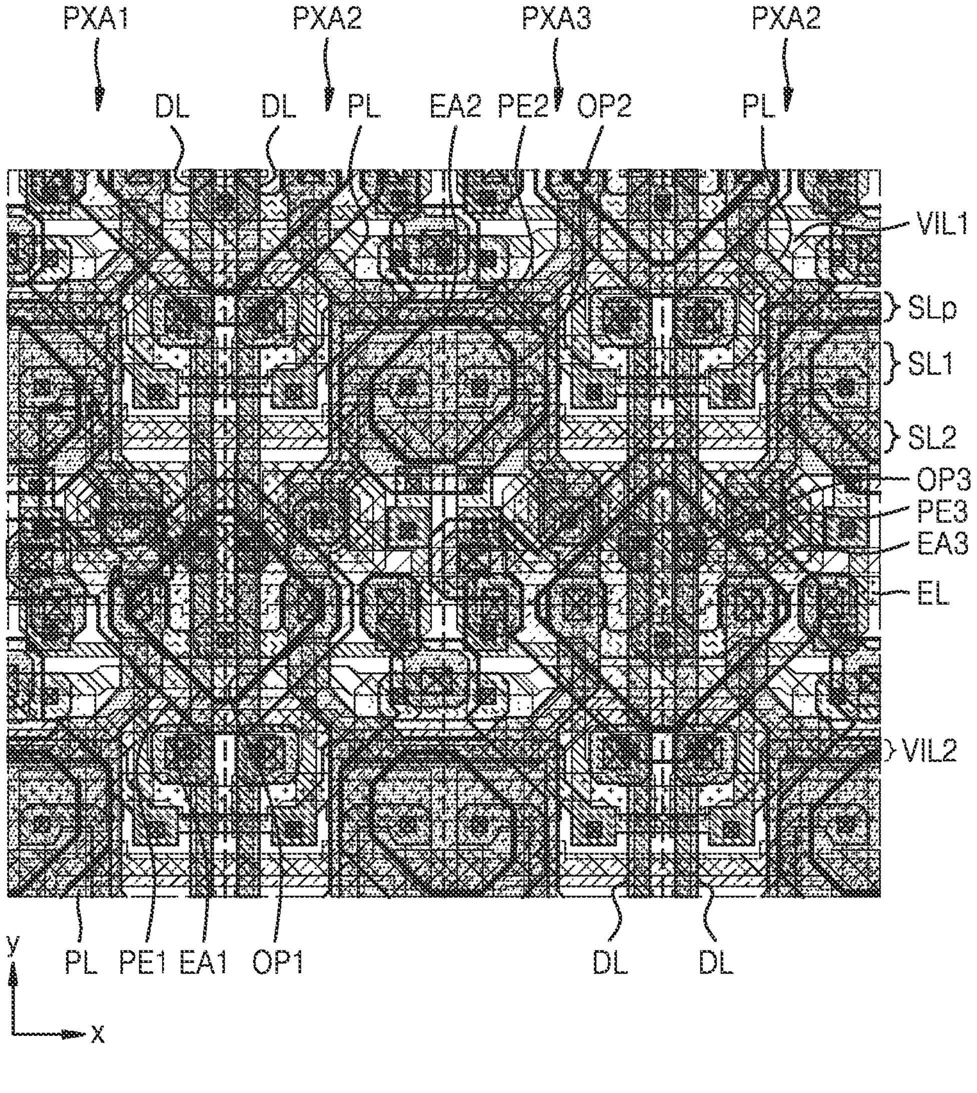
FIG. 8 is a schematic plan view showing positions of elements constituting a sub-pixel according to an embodiment.
Figure 9:
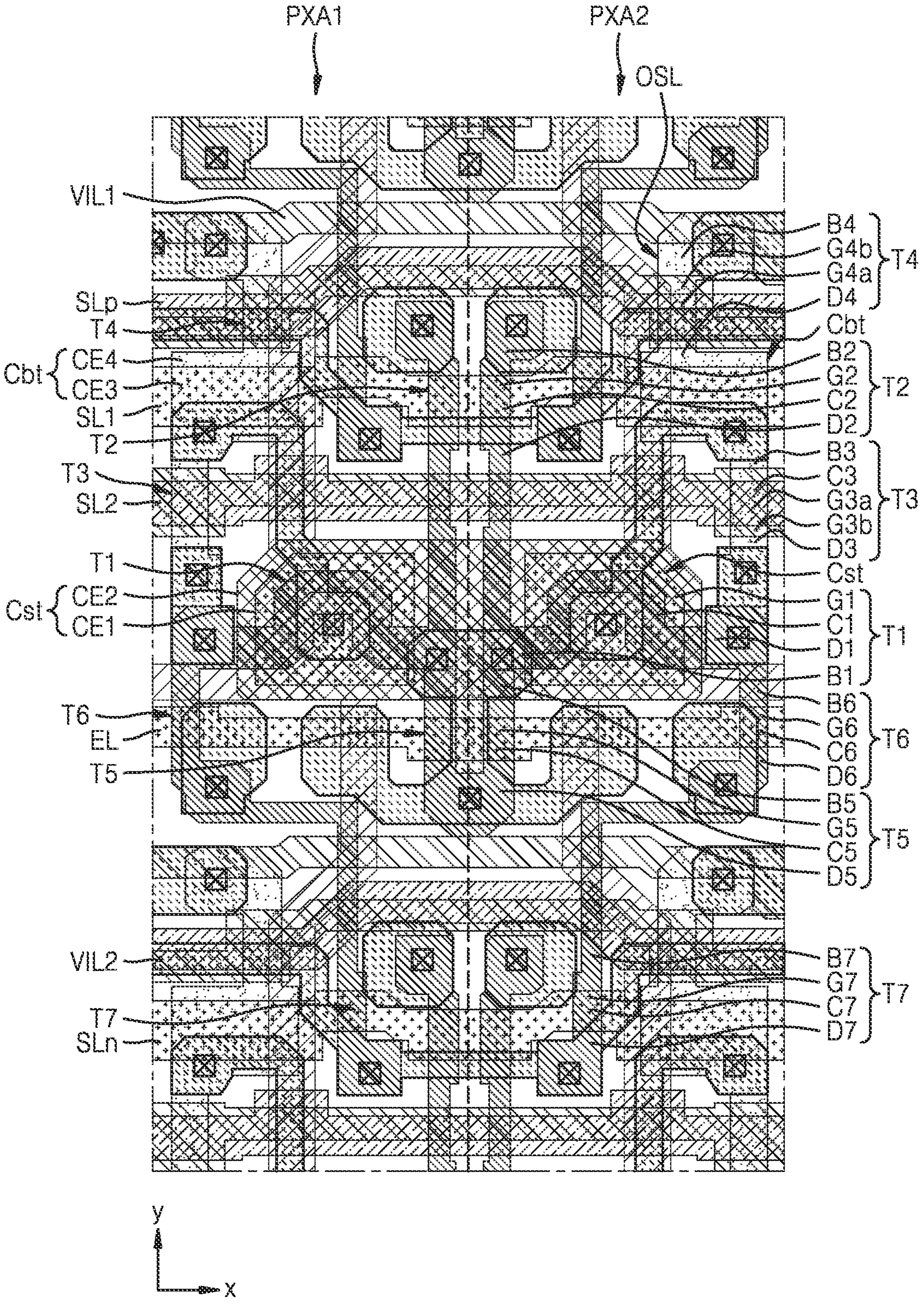
FIG. 9 is a partial excerpt from FIG. 8 and schematically shows positions of elements arranged in two adjacent sub-pixel areas.
Figure 10:
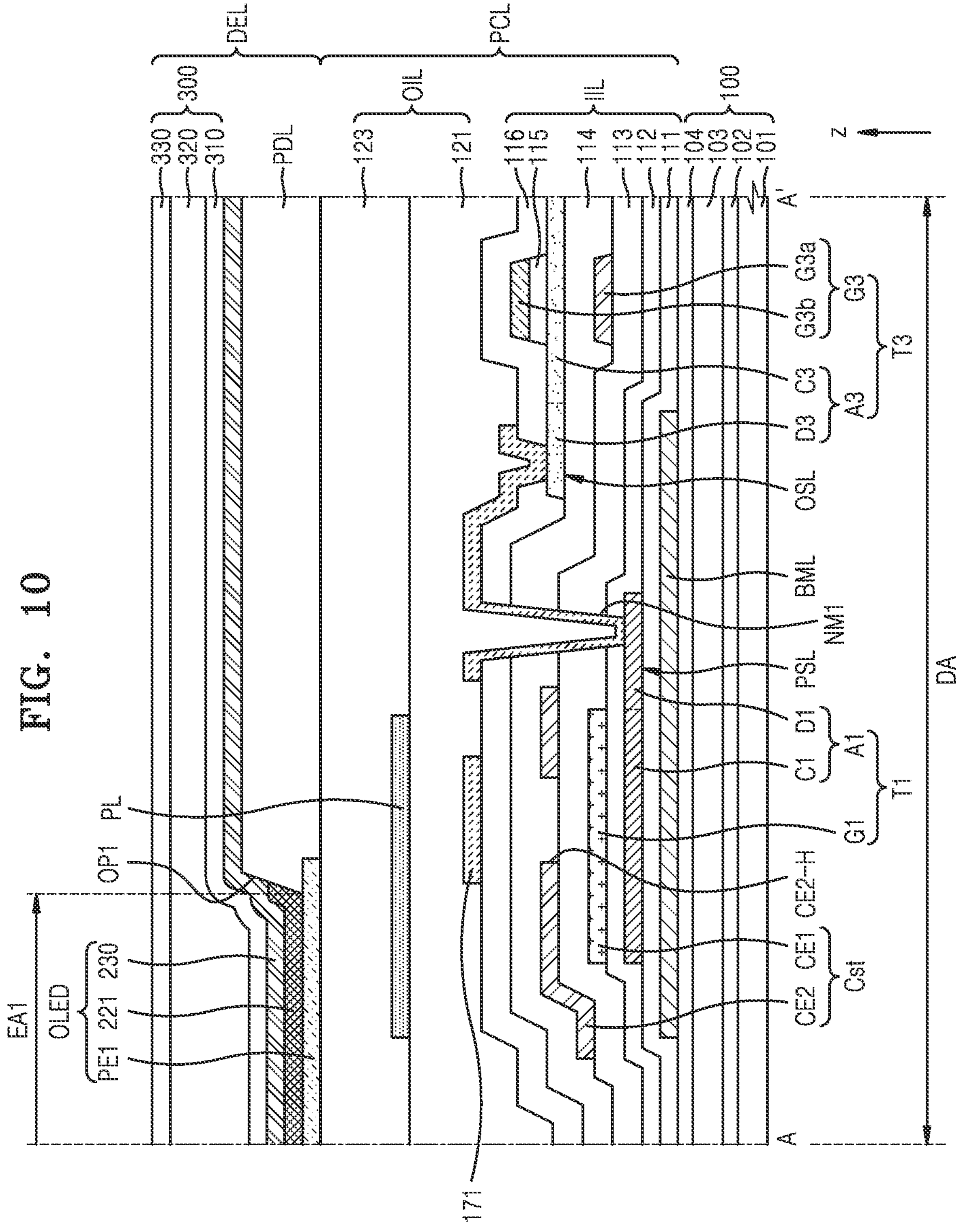
FIG. 10 is a schematic cross-sectional view of the sub-pixel taken along line A-A' of FIG. 8.

FIG. 8 is a schematic plan view showing positions of elements constituting a sub-pixel according to an embodiment. FIG. 9 is a partial excerpt from FIG. 8 and schematically shows positions of elements arranged in two adjacent sub-pixel areas. FIG. 10 is a schematic cross-sectional view of the sub-pixel taken along line A-A' of FIG. 8. FIG. 8 may correspond to a plan view of the sub-pixel shown in FIG. 2. Hereinafter, because the same elements may be disposed on each layer of the first to third sub-pixels PX1, PX2, and PX3, the first to third sub-pixels PX1, PX2, and PX3 will not be separately described.

Referring to FIGS. 8 and 9, a first sub-pixel area PXA1 in which the sub-pixel circuit of the first sub-pixel PX1 is disposed, a second sub-pixel area PXA2 in which the sub-pixel circuit of the second sub-pixel PX2 is disposed, and a third sub-pixel area PXA3 in which the sub-pixel circuit of the third sub-pixel PX3 is disposed may be repeatedly arranged in the x direction at equal intervals in each row on the substrate 100.

Sub-pixel circuits arranged in the same row and disposed in two adjacent sub-pixel areas may have a symmetrical structure with respect to an imaginary line between the two sub-pixel areas. For example, the sub-pixel circuit of the first sub-pixel area PXA1 and the sub-pixel circuit of the second sub-pixel area PXA2, shown in FIG. 9, may have a symmetrical structure with respect to an imaginary line between the first sub-pixel area PXA1 and the second sub-pixel area PXA2.

The sub-pixel circuit of each sub-pixel may include a driving transistor T1, a switching transistor T2, a compensation transistor T3, a first initialization transistor T4, an operation control transistor T5, an emission control transistor T6, a second initialization transistor T7, a first capacitor Cst, and a second capacitor Cbt.

Referring to FIG. 10, the display apparatus may include a display panel, and the display panel may include a substrate 100, a sub-pixel circuit layer PCL, and a display element layer DEL.

The sub-pixel circuit layer PCL may define a sub-pixel circuit. The sub-pixel circuit layer PCL may include components of multiple thin-film transistors and capacitors and multiple insulating layers disposed below and/or above the components. In this regard, FIG. 10 shows a driving transistor T1, a compensation transistor T3, and a first capacitor Cst among the thin-film transistors and capacitors included in the sub-pixel circuit. The sub-pixel circuit layer PCL may include inorganic insulating layers IIL and organic insulating layers OIL. For example, as shown in FIG. 10, the inorganic insulating layers IIL may include a buffer layer 111, a first gate insulating layer 112, a first interlayer insulating layer 113, a second interlayer insulating layer 114, a second gate insulating layer 115, and a third interlayer insulating layer 116. The organic insulating layers OIL may include a first organic insulating layer 121 and a second organic insulating layer 123.

The substrate 100 may include a glass material, a ceramic material, a metal material, a plastic material, or a material that is flexible or bendable. In case that the substrate 100 is flexible or bendable, the substrate 100 may include polymer resin, such as polyethersulphone (PES), polyacrylate, polyetherimide (PEI), polyethylene naphthalate (PEN), polyethylene terephthalate (PET), polyphenylene sulfide (PPS), polyarylate, polyimide (PI), polycarbonate (PC), or cellulose acetate propionate (CAP).

The substrate 100 may have a single-layered or multi-layered structure including the material described above, and may further include an inorganic material layer in the case of a multi-layered structure. For example, the substrate 100 may include a first organic base layer 101, a first inorganic barrier layer 102, a second organic base layer 103, and a second inorganic barrier layer 104. Each of the first organic base layer 101 and the second organic base layer 103 may include polymer resin. The first inorganic barrier layer 102 and the second inorganic barrier layer 104 may be barrier layers that prevent penetration of external foreign materials, and may have a single-layered or multi-layered structure including an inorganic insulating material, such as silicon nitride and/or silicon oxide.

A lower metal layer BML may be disposed on the substrate 100. The lower metal layer BML may include one or more materials selected from aluminum (Al), platinum (Pt), palladium (Pd), silver (Ag), magnesium (Mg), gold (Au), nickel (Ni), neodymium (Nd), iridium (Ir), chromium (Cr), lithium (Li), calcium (Ca), molybdenum (Mo), titanium (Ti), tungsten (W), and copper (Cu). In some embodiments, the lower metal layer BML may have a single-layered structure including Mo, a double-layered structure in which a Mo layer and a Ti layer are stacked on each other, or a triple-layered structure in which a Ti layer, an Al layer, and a Ti layer are stacked on each other.

The buffer layer 111 may be disposed on the lower metal layer BML. The buffer layer 111 may be an inorganic insulating layer including an inorganic insulating material, such as silicon nitride and/or silicon oxide, and may have a single-layered or multi-layered structure including the aforementioned inorganic insulating material.

Silicon semiconductor layers of silicon-based transistors may be disposed on the buffer layer 111. In this regard, FIG. 10 shows a first semiconductor layer A1 of the driving transistor T1 corresponding to a portion of a silicon semiconductor pattern PSL. The first semiconductor layer A1 may include a first channel region C1 and impurity regions disposed on both sides of the first channel region C1 and doped with impurities. In this regard, FIG. 10 shows a second region D1 that is one of the impurity regions and disposed on one side of the first channel region C1.

The first gate insulating layer 112 may be disposed on the silicon semiconductor pattern PSL. The first gate insulating layer 112 may be an inorganic insulating layer including an inorganic insulating material, such as silicon oxide, silicon nitride, and/or silicon oxynitride, and may have a single-layered or multi-layered structure including the aforementioned inorganic insulating material.

A first gate electrode G1 and a first capacitor electrode CE1 may be disposed on the first gate insulating layer 112. FIG. 10 shows that the first gate electrode G1 is formed integrally with the first capacitor electrode CE1. In other words, the first gate electrode G1 may perform the function of the first capacitor electrode CE1, or the first capacitor electrode CE1 may perform the function of the first gate electrode G1.

The first gate electrode G1 and/or the first capacitor electrode CE1 may include Al, Pt, Pd, Ag, Mg, Au, Ni, Nd, Ir, Cr, Li, Ca, Mo, Ti, W, and/or Cu, and may include a single layer or multiple layers including the aforementioned materials.

The first interlayer insulating layer 113 may be disposed on the first gate electrode G1 and/or the first capacitor electrode CE1. The first interlayer insulating layer 113 may be an inorganic insulating layer including an inorganic insulating material, such as silicon oxide, silicon nitride, and/or silicon oxynitride, and may have a single-layered or multi-layered structure including the aforementioned inorganic insulating material.

A second capacitor electrode CE2 may be disposed on the first interlayer insulating layer 113. The second capacitor electrode CE2 may include Al, Pt, Pd, Ag, Mg, Au, Ni, Nd, Ir, Cr, Li, Ca, Mo, Ti, W, and/or Cu, and may include a single layer or multiple layers including the aforementioned materials. The second capacitor electrode CE2 may overlap the first gate electrode G1 and/or the first capacitor electrode CE1. The second capacitor electrode CE2 may include a hole CE2-H so that a node connection electrode 171 for electrically connecting the first gate electrode G1 of the driving transistor T1 to the compensation transistor T3 is connected to the first gate electrode G1. The hole CE2-H may partially overlap the first gate electrode G1.

The second interlayer insulating layer 114 may be disposed on the second capacitor electrode CE2. The second interlayer insulating layer 114 may be an inorganic insulating layer including an inorganic insulating material, such as silicon oxide, silicon nitride, and/or silicon oxynitride, and may have a single-layered or multi-layered structure including the aforementioned inorganic insulating material.

Oxide semiconductor layers may be disposed on the second interlayer insulating layer 114. In this regard, FIG. 10 shows a third semiconductor layer A3 of the compensation transistor T3 corresponding to a portion of an oxide semiconductor pattern OSL. The third semiconductor layer A3 may include a third channel region C3 and conductive regions disposed on both sides of the third channel region C3. In this regard, FIG. 10 shows a region D3 that may be one of the conductive regions and disposed on one side of the third channel region C3. The vertical distance from the substrate 100 to the third semiconductor layer A3 may be greater than the vertical distance from the substrate 100 to the first semiconductor layer A1.

The third gate electrode G3 may be disposed below and/or above the third semiconductor layer A3. As an example, FIG. 10 shows that the third gate electrode G3 includes a third lower gate electrode G3*a* disposed below the third semiconductor layer A3 and a third upper gate electrode G3*b* disposed above the third semiconductor layer A3. In another embodiment, either the third lower gate electrode G3*a* or the third upper gate electrode G3*b* may be omitted.

The third lower gate electrode G3*a* may include the same material as the second capacitor electrode CE2 and may be located on the same layer (e.g., the first interlayer insulating layer 113) as the second capacitor electrode CE2. The third upper gate electrode G3*b* may be disposed on the third semiconductor layer A3 with the second gate insulating layer 115 therebetween. The third upper gate electrode G3*b* may include Al, Pt, Pd, Ag, Mg, Au, Ni, Nd, Ir, Cr, Li, Ca, Mo, Ti, W, and/or Cu, and may include a single layer or multiple layers including the aforementioned materials.

Although FIG. 10 shows that the second gate insulating layer 115 is disposed only between the third upper gate electrode G3*b* and the third semiconductor layer A3, the disclosure is not limited thereto. In another embodiment, the second gate insulating layer 115 may be formed to entirely cover the substrate 100 like another insulating layer, for example, the first gate insulating layer 112. The second gate insulating layer 115 may be an inorganic insulating layer including an inorganic insulating material, such as silicon oxide, silicon nitride, and/or silicon oxynitride, and may have a single-layered or multi-layered structure including the aforementioned inorganic insulating material.

The third interlayer insulating layer 116 may be disposed on the third upper gate electrode G3*b*. The third interlayer insulating layer 116 may be an inorganic insulating layer including an inorganic insulating material, such as silicon oxide, silicon nitride, and/or silicon oxynitride, and may have a single-layered or multi-layered structure including the aforementioned inorganic insulating material.

The node connection electrode 171 and a first connection electrode NM1 may be disposed on the third interlayer insulating layer 116. Each of the node connection electrode 171 and the first connection electrode NM1 may include Al, Pt, Pd, Ag, Mg, Au, Ni, Nd, Ir, Cr, Li, Ca, Mo, Ti, W, and/or Cu, and may include a single layer or multiple layers including the aforementioned materials. For example, each of the node connection electrode 171 and the first connection electrode NM1 may have a triple-layered structure in which a Ti layer, an Al layer, and a Ti layer are stacked on each other.

The first connection electrode NM1 may electrically connect the first semiconductor layer A1 to the third semiconductor layer A3. The first connection electrode NM1 may be connected to a portion (e.g., a portion D1 in FIG. 10) of the first semiconductor layer A1 through a contact hole passing through inorganic insulating layers between the first semiconductor layer A1 and the first connection electrode NM1. The first connection electrode NM1 may be connected to a portion (e.g., a portion D3 in FIG. 10) of the third semiconductor layer A3 through a contact hole passing through the third interlayer insulating layer 116 between the third semiconductor layer A3 and the first connection electrode NM1.

The lower metal layer BML may have a voltage level of a constant voltage. The lower metal layer BML may prevent negative charges from gathering in a lower portion of the first semiconductor layer A1 of the driving transistor T1, thereby preventing or reducing afterimages caused by the negative charges.

The first organic insulating layer 121 may be formed on the first connection electrode NM1 and the node connection electrode 171. The first organic insulating layer 121 may include an organic material, such as acrylic, benzocyclobutene (BCB), polyimide, and/or hexamethyldisiloxane (HMDSO).

A driving voltage line PL may be disposed on the first organic insulating layer 121. The second organic insulating layer 123 may be disposed on the driving voltage line PL. The driving voltage line PL may include Al, Pt, Pd, Ag, Mg, Au, Ni, Nd, Ir, Cr, Li, Ca, Ti, and/or W. In some embodiments, the driving voltage line PL may have a triple-layered structure including a Ti layer, an Al layer, and a Ti layer.

The second organic insulating layer 123 may include an organic material, such as BCB, polyimide, and/or HMDSO.

The display element layer DEL may be disposed on the sub-pixel circuit layer PCL. The display element layer DEL may include display elements. For example, the display element layer DEL may include an organic light-emitting diode OLED. The organic light-emitting diode OLED may include a sub-pixel electrode, an emission layer, and an opposite electrode 230. For example, the organic light-emitting diode OLED corresponding to the first sub-pixel PX1 may include a first sub-pixel electrode PE1, a first emission layer 221, and the opposite electrode 230.

The sub-pixel electrode of the organic light-emitting diode OLED may be formed on the second organic insulating layer 123. The emission layer may include a low molecular weight or high molecular weight organic material. At least one layer selected from a hole injection layer (HIL), a hole transport layer (HTL), an electron transport layer (ETL), and an electron injection layer (EIL) may be further arranged between the sub-pixel electrode and the opposite electrode 230.

An edge of the sub-pixel electrode may be covered by a bank layer PDL, and an inner portion of the sub-pixel electrode may overlap the emission layer through an opening of the bank layer PDL. For example, an inner portion of the first sub-pixel electrode PE1 may overlap the first emission layer 221 through a first opening OP1 of the bank layer PDL. The first emission area EA1 corresponding to the first sub-pixel PX1 may be defined by the first opening OP1 of the bank layer PDL.

While the sub-pixel electrode is formed for each organic light-emitting diode OLED, the opposite electrode 230 may be formed to correspond to multiple organic light-emitting diodes OLED. In other words, the organic light-emitting diodes OLED may share the opposite electrode 230, and a stacked structure in which the sub-pixel electrode, the emission layer, and a portion of the opposite electrode 230 are stacked on each other may correspond to an organic light-emitting diodes OLED.

An encapsulation layer 300 may be disposed on the organic light-emitting diode OLED. The encapsulation layer 300 may include at least one inorganic encapsulation layer and at least one organic encapsulation layer. FIG. 10 shows that the encapsulation layer 300 includes a first inorganic encapsulation layer 310, an organic encapsulation layer 320, and a second inorganic encapsulation layer 330, as an example. The first inorganic encapsulation layer 310 and the second inorganic encapsulation layer 330 may include silicon oxide, silicon nitride, and/or silicon oxynitride, and the organic encapsulation layer 320 may include an organic insulating material.

FIGS. 11A to 11I are schematic plan views illustrating the elements of FIG. 8 for each layer.

Referring to FIGS. 8 to 10 and FIG. 11A, the lower metal layer BML may be disposed on the substrate 100. The lower metal layer BML may include the material described above with reference to FIG. 10. For example, the lower metal layer BML may be a single layer including Mo, a double layer in which a Mo layer and a Ti layer are stacked on each other, or a triple layer in which a Ti layer, an Al layer, and a Ti layer are stacked on each other.

The lower metal layer BML may include a portion (hereinafter, referred to as a main portion BML-m) positioned in each of the first sub-pixel area PXA1, the second sub-pixel area PXA2, and the third sub-pixel area PXA3 in each row. Each main portion BML-m may be connected to other portions (hereinafter, referred to as branch portions BML-b) respectively extending in the x direction and the y direction.

The lower metal layer BML disposed in adjacent sub-pixel areas, for example, the first sub-pixel area PXA1 and the second sub-pixel area PXA2, may be substantially symmetrical with respect to an imaginary line between the first sub-pixel area PXA1 and the second sub-pixel area PXA2. The main portion BML-m disposed in the first sub-pixel area PXA1 and the main portion BML-m disposed in the second sub-pixel area PXA2 may be directly connected to each other.

Referring to FIGS. 8 to 10 and FIG. 11B, the buffer layer 111 (see FIG. 10) may be disposed on the lower metal layer BML, and the silicon semiconductor pattern PSL may be disposed on the buffer layer 111. Referring to 11B, in each row, the silicon semiconductor pattern PSL may be continuously disposed in the first sub-pixel area PXA1 and the second sub-pixel area PXA2 adjacent to each other and in the third sub-pixel area PXA3 and the second sub-pixel area PXA2 adjacent to each other. The silicon semiconductor pattern PSL disposed in the adjacent sub-pixel areas, for example, the first sub-pixel area PXA1 and the second sub-pixel area PXA2, may be substantially symmetrical with respect to an imaginary line between the first sub-pixel area PXA1 and the second sub-pixel area PXA2. The silicon semiconductor pattern PSL may include a silicon-based material, such as polycrystalline silicon.

In each sub-pixel area, the silicon semiconductor pattern PSL may be curved in various shapes. As shown in FIGS. 9 and 10, a first semiconductor layer A1 of the driving transistor T1, a second semiconductor layer of the switching transistor T2, a fifth semiconductor layer of the operation control transistor T5, a sixth semiconductor layer of the emission control transistor T6, and a seventh semiconductor layer of the second initialization transistor may be arranged along the silicon semiconductor pattern PSL.

The first semiconductor layer A1 may include a first channel region C1 and first and second regions B1 and D1 disposed on both sides of the first channel region C1. The first and second regions B1 and D1 of the first semiconductor layer A1 may be impurity-doped regions and have higher electrical conductivity than that of the first channel region C1. One of the first and second regions B1 and D1 may be a source region and the other may be a drain region. The first channel region C1 may have a curved shape (e.g., an omega-shaped curved shape) in a plan view, and may increase the length of the first channel region C1 in a narrow space according to the aforementioned shape.

The first semiconductor layer A1 may overlap the lower metal layer BML. For example, the first channel region C1 of the first semiconductor layer A1 may overlap the lower metal layer BML. For example, the first channel region C1 of the first semiconductor layer A1 may overlap the main portion BML-m, which is a portion of the lower metal layer BML.

The second semiconductor layer may include a second channel region C2 and first and second regions B2 and D2 disposed on both sides of the second channel region C2. The first and second regions B2 and D2 of the second semiconductor layer may be impurity-doped regions and have higher electrical conductivity than that of the second channel region C2. One of the first and second regions B2 and D2 may be a source region and the other may be a drain region.

The fifth semiconductor layer may include a fifth channel region C5 and first and second regions B5 and D5 disposed on both sides of the fifth channel region C5. The first and second regions B5 and D5 of the fifth semiconductor layer may be impurity-doped regions and have higher electrical conductivity than that of the fifth channel region C5. One of the first and second regions B5 and D5 may be a source region and the other may be a drain region.

The sixth semiconductor layer may include a sixth channel region C6 and first and second regions B6 and D6 disposed on both sides of the sixth channel region C6. The first and second regions B6 and D6 of the sixth semiconductor layer may be impurity-doped regions and have higher electrical conductivity than that of the sixth channel region C6. One of the first and second regions B6 and D6 may be a source region and the other may be a drain region.

The seventh semiconductor layer may include a seventh channel region C7 and first and second regions B7 and D7 disposed on both sides of the seventh channel region C7. The first and second regions B7 and D7 of the seventh semiconductor layer may be impurity-doped regions and have higher electrical conductivity than that of the seventh channel region C7. One of the first and second regions B7 and D7 may be a source region and the other may be a drain region.

Referring to FIGS. 8 to 10 and FIG. 11C, the first gate insulating layer 112 may be disposed on the silicon semiconductor pattern PSL, and a first gate electrode G1 of the driving transistor T1, a second gate electrode G2 of the switching transistor T2, a fifth gate electrode G5 of the operation control transistor T5, a sixth gate electrode G6 of the emission control transistor T6, and a seventh gate electrode G7 of the second initialization transistor T7 may be disposed on the first gate insulating layer 112. A first capacitor electrode CE1, a first scan line SL1, a subsequent scan line SLn, and an emission control line EL may be disposed on the first gate insulating layer 112. The subsequent scan line SLn may be a first scan line of a next row.

The first gate electrode G1 may have an isolated shape in a plan view, and the first gate electrode G1 may include the first capacitor electrode CE1. In other words, the first gate electrode G1 and the first capacitor electrode CE1 may be integrally formed as a single element, and it may be expressed that the first capacitor electrode CE1 includes the first gate electrode G1.

The first gate electrode G1 and/or the first capacitor electrode CE1 may be formed to entirely cover the first channel region C1 of the first semiconductor layer A1. The main portion BML-m of the lower metal layer BML may have a larger area than that of the first gate electrode G1 and/or that of the first capacitor electrode CE1. The main portion BML-m of the lower metal layer BML may entirely overlap the first channel region C1 of the first semiconductor layer A1.

The first gate electrode G1 and/or the first capacitor electrode CE1 disposed in each of the first and second sub-pixel areas PXA1 and PXA2 adjacent to each other may be substantially symmetrical with respect to an imaginary line between the first sub-pixel area PXA1 and the second sub-pixel area PXA2. The first scan line SL1 (or the subsequent scan line SLn) disposed in the first and second sub-pixel areas PXA1 and PXA2 may be substantially symmetrical with respect to the imaginary line. The emission control line EL disposed in the first and second sub-pixel areas PXA1 and PXA2 may be substantially symmetrical with respect to the imaginary line. The first scan line SL1, the subsequent scan line SLn, and the emission control line EL may each extend in the x direction to pass through the first and second sub-pixel areas PXA1 and PXA2. The first scan line SL1, the subsequent scan line SLn, and the emission control line EL may be apart from each other with the first gate electrode G1 and/or the first capacitor electrode CE1 therebetween in a plan view.

The first scan line SL1 may include the second gate electrode G2 and a third capacitor electrode CE3. The subsequent scan line SLn may include the seventh gate electrode G7. A portion of the first scan line SL1 may include a portion having a relatively larger width in the y direction than other portions, and the portion having a relatively larger width may correspond to the third capacitor electrode CE3. The emission control line EL may include the fifth gate electrode G5 and the sixth gate electrode G6.

The first scan line SL1, the subsequent scan line SLn, and the emission control line EL may include the same material as the first gate electrode G1 and/or the first capacitor electrode CE1. The material is as described above with reference to FIG. 10.

Figure 11A:
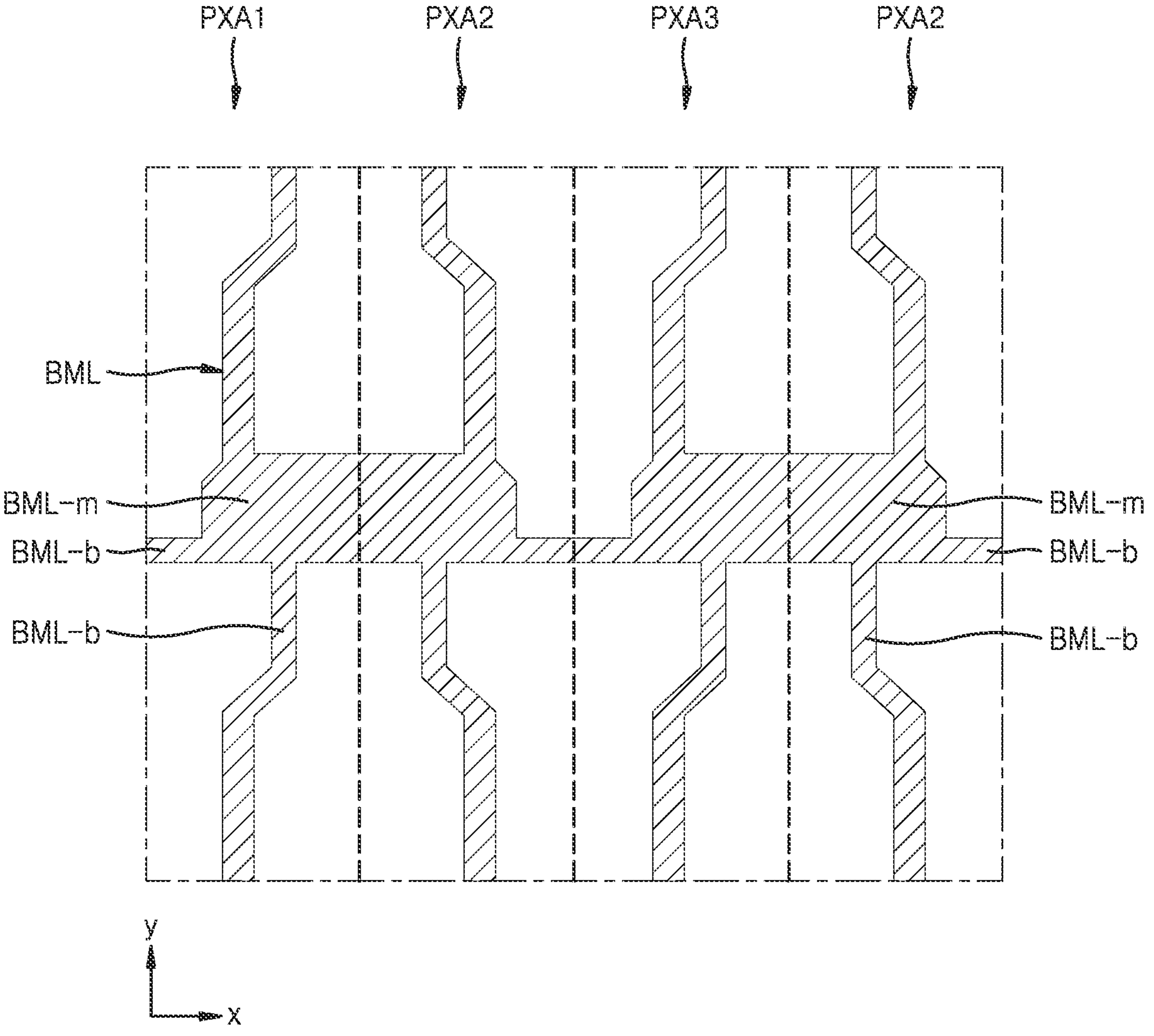
FIGS. 11A to 11I are schematic plan views illustrating the elements of FIG. 8 for each layer.
Figure 11B:
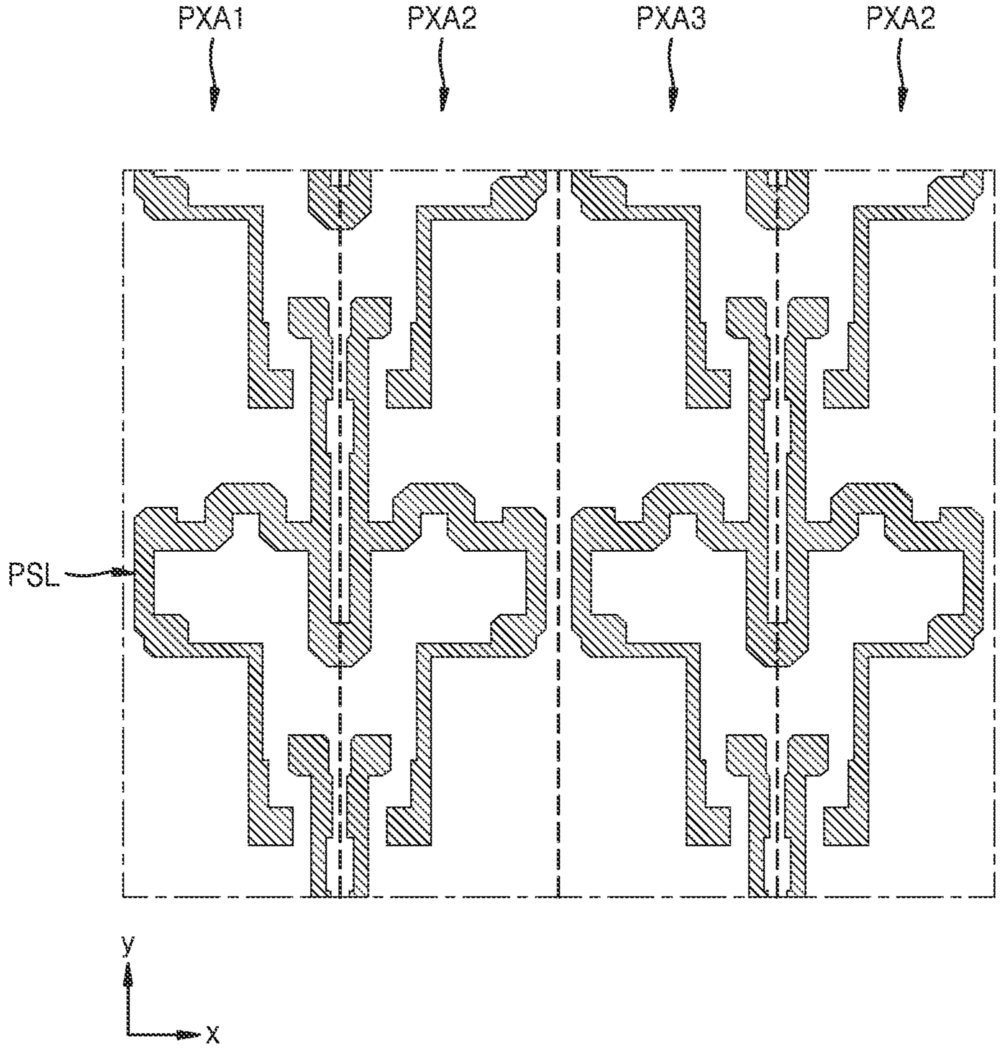
Figure 11C:
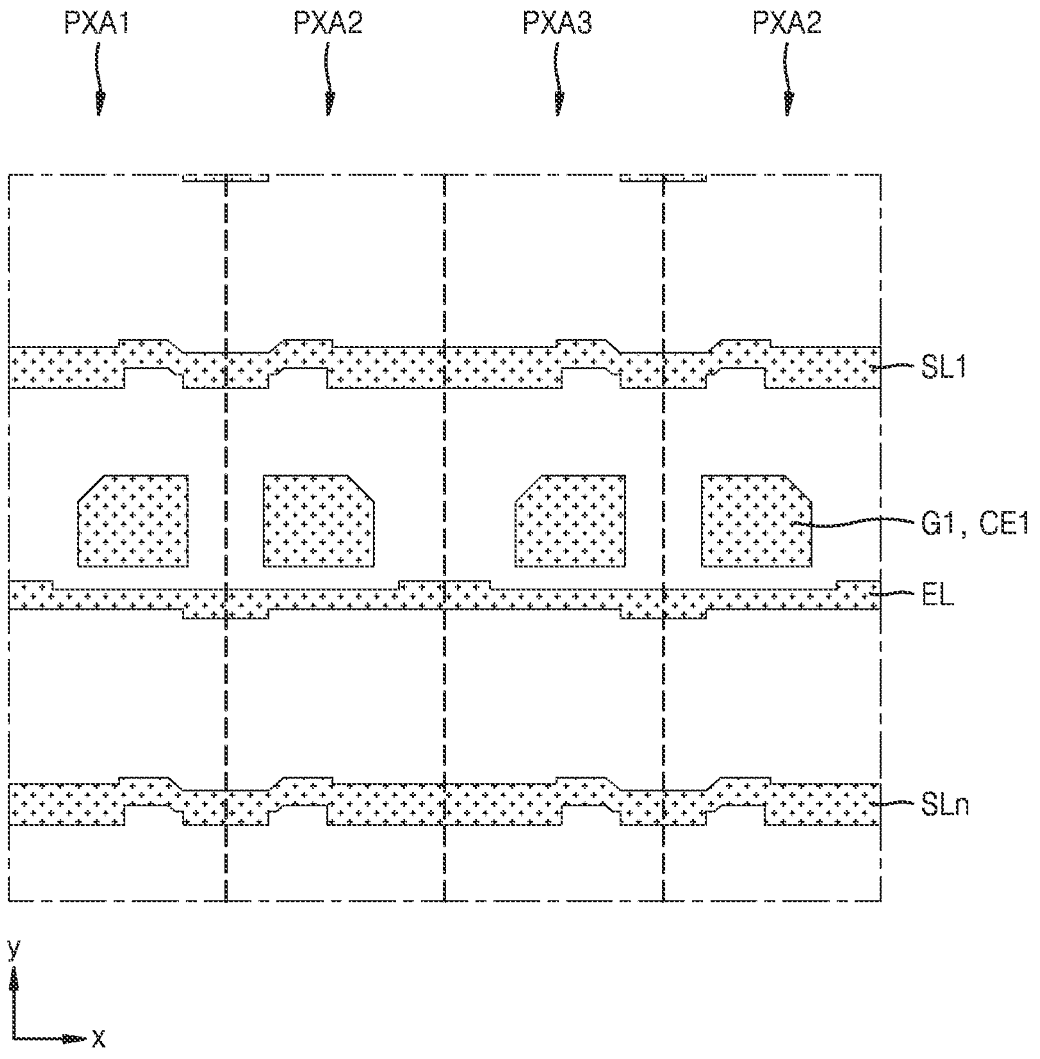

Referring to FIGS. 8 to 10 and FIG. 11D, the first interlayer insulating layer 113 (see FIG. 10) may be disposed on the layer shown in FIG. 11C, and the second capacitor electrode CE2, a third lower gate line GL3*aa*, a fourth lower gate line GL4*aa*, and a first initialization voltage line VIL1 may be formed.

The second capacitor electrode CE2 may overlap the first capacitor electrode CE1 and may include a hole CE2-H exposing a portion of the first capacitor electrode CE1. The hole CE2-H may have a structure entirely surrounded by a material portion constituting the second capacitor electrode CE2 in a plan view. The first capacitor electrode CE1 and the second capacitor electrode CE2 may form the first capacitor Cst. Second capacitor electrodes CE2 respectively disposed in the first and second sub-pixel areas PXA1 and PXA2 adjacent to each other may be integrally connected to each other.

The first initialization voltage line VIL1, the third lower gate line GL3*aa*, and the fourth lower gate line GL4*bb* may extend in the x direction. Each of the first initialization voltage line VIL1, the third lower gate line GL3*aa*, and the fourth lower gate line GL4*bb* disposed in the first and second sub-pixel areas PXA1 and PXA2 may have a shape substantially symmetrical with respect to an imaginary line between the first sub-pixel area PXA1 and the second sub-pixel area PXA2.

The third lower gate line GL3*aa* may include a third lower gate electrode G3*a*, and the fourth lower gate line GL4*aa* may include a fourth lower gate electrode G4*a*.

The second capacitor electrode CE2, the third lower gate line GL3*aa*, and the fourth lower gate line GL4*aa* may include the same material and may be disposed on the same layer (i.e., the first interlayer insulating layer 113 in FIG. 10). The first initialization voltage line VIL1, the third lower gate line GL3*aa*, and the fourth lower gate line GL4*aa* may include the same material as the second capacitor electrode CE2 described with reference to FIG. 10.

Figure 11D:
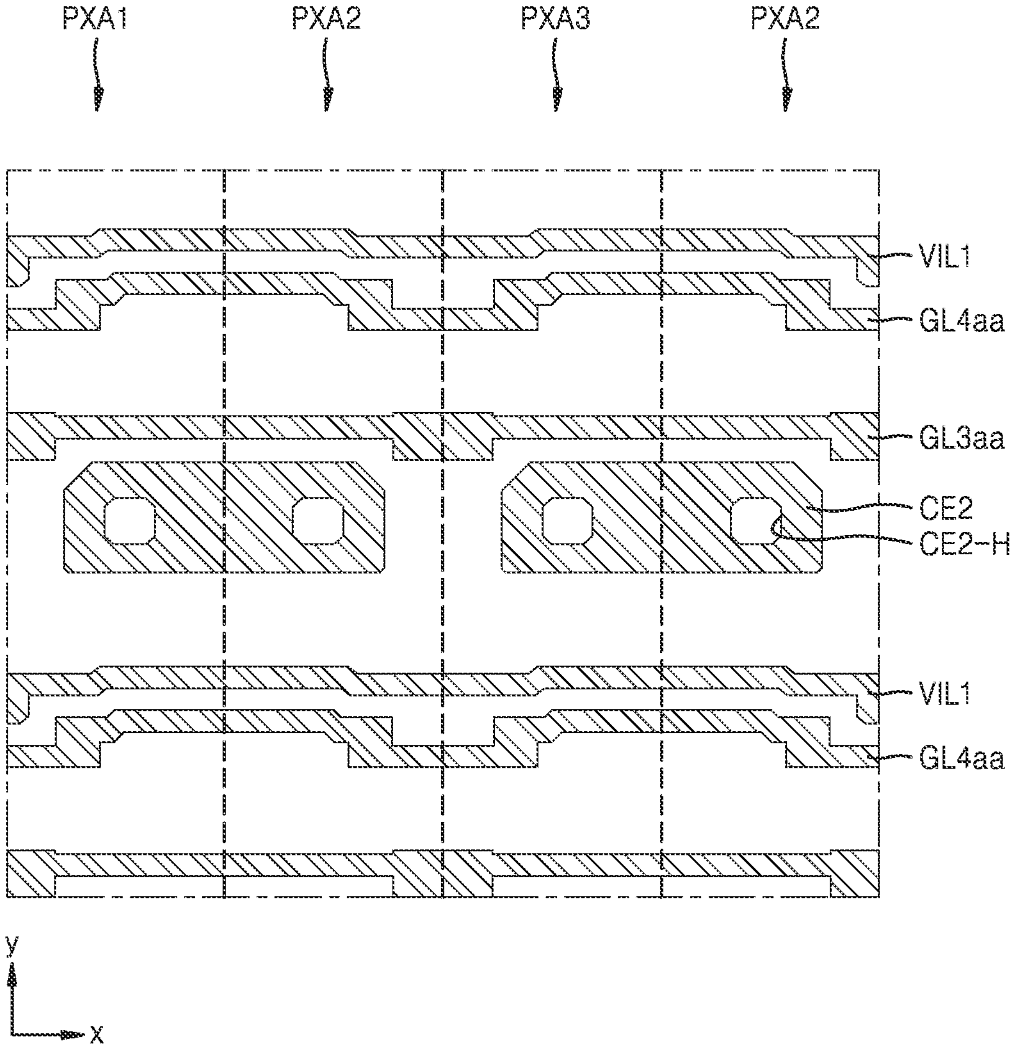
Figure 11E:
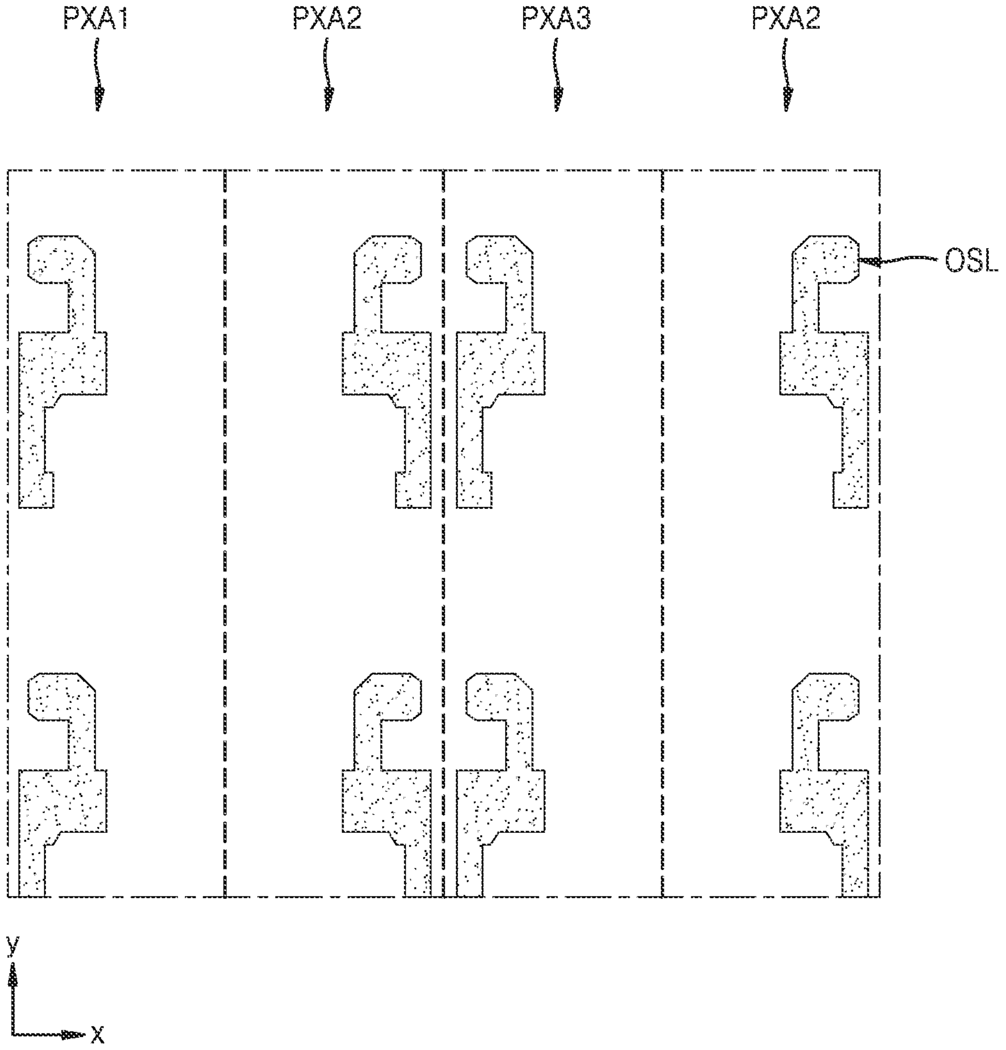

Referring to FIGS. 8 to 10 and FIG. 11E, the second interlayer insulating layer 114 (see FIG. 10) may be disposed on the layer shown in FIG. 11D, and an oxide semiconductor pattern OSL may be disposed on the second interlayer insulating layer 114. Oxide semiconductor patterns OSL respectively disposed in the first and second sub-pixel areas PXA1 and PXA2 adjacent to each other may be symmetrical to each other with respect to a vertical line between the first sub-pixel area PXA1 and the second sub-pixel area PXA2 The oxide semiconductor patterns OSL disposed in the first and second sub-pixel areas PXA1 and PXA2 may be connected to each other and integrally formed as a single body.

The oxide semiconductor pattern OSL may include an oxide-based semiconductor material, such as Zn oxide, In—Zn oxide, and/or Ga—In—Zn oxide. In some embodiments, the oxide semiconductor pattern OSL may include an In—Ga—Zn—O (IGZO) semiconductor, an In—Sn—Zn—O (ITZO) semiconductor, and/or In—Ga—Sn—Zn—O (IGTZO) semiconductor, in which metals, such as indium (In), gallium (Ga), and/or tin (Sn) are contained in ZnO, The oxide semiconductor pattern OSL may include a third semiconductor layer A3 of the compensation transistor T3 and a fourth semiconductor layer of the first initialization transistor T4. The third semiconductor layer A3 and the fourth semiconductor layer may be connected to each other and integrally provided as a single body.

The third semiconductor layer A3 may include a third channel region C3 and first and second regions B3 and D3 disposed on both sides of the third channel region C3. The first and second regions B3 and D3 of the third semiconductor layer A3 may be conductive regions and have higher electrical conductivity than that of the third channel region C3. One of the first and second regions B3 and D3 may be a source region and the other may be a drain region.

The fourth semiconductor layer may include a fourth channel region C4 and first and second regions B4 and D4 disposed on both sides of the fourth channel region C4. The first and second regions B4 and D4 of the fourth semiconductor layer may be conductive regions and have higher electrical conductivity than that of the fourth channel region C4. One of the first and second regions B4 and D4 may be a source region and the other may be a drain region.

The oxide semiconductor pattern OSL may include a fourth capacitor electrode CE4. A portion of the oxide semiconductor pattern OSL overlapping the third capacitor electrode CE3 (see FIG. 11D) may correspond to the fourth capacitor electrode CE4. The third capacitor electrode CE3 and the fourth capacitor electrode CE4 may form the second capacitor Cbt.

Referring to FIGS. 8 to 10 and FIG. 11F, a third upper gate line GL3*ba* and a fourth upper gate line GL4*ba* may be formed on the layer shown in FIG. 11D.

The third lower gate line GL3*aa* and the fourth lower gate line GL4*aa* may each extend in the x direction. Each of the third lower gate line GL3*aa* and the fourth lower gate line GL4*aa* disposed in the first and second sub-pixel areas PXA1 and PXA2 may have a substantially symmetrical shape with respect to an imaginary line between the first sub-pixel area PXA1 and the second sub-pixel area PXA2.

At least a portion of the third upper gate line GL3*ba* may overlap the third lower gate line GL3*aa* with the oxide semiconductor pattern OSL therebetween. The third upper gate line GL3*ba* may include a third upper gate electrode G3*b*. At least a portion of the fourth upper gate line GL4*ba* may overlap the fourth lower gate line GL4*aa* with the oxide semiconductor pattern OSL therebetween. The fourth upper gate line GL4*ba* may include a fourth upper gate electrode G4*b*.

The fourth upper gate electrode G4*b*, the third upper gate line GL3*ba*, and the fourth upper gate line GL4*ba* may include the same material as the third upper gate electrode G3*b* previously described with reference to FIG. 10.

Figure 11F:
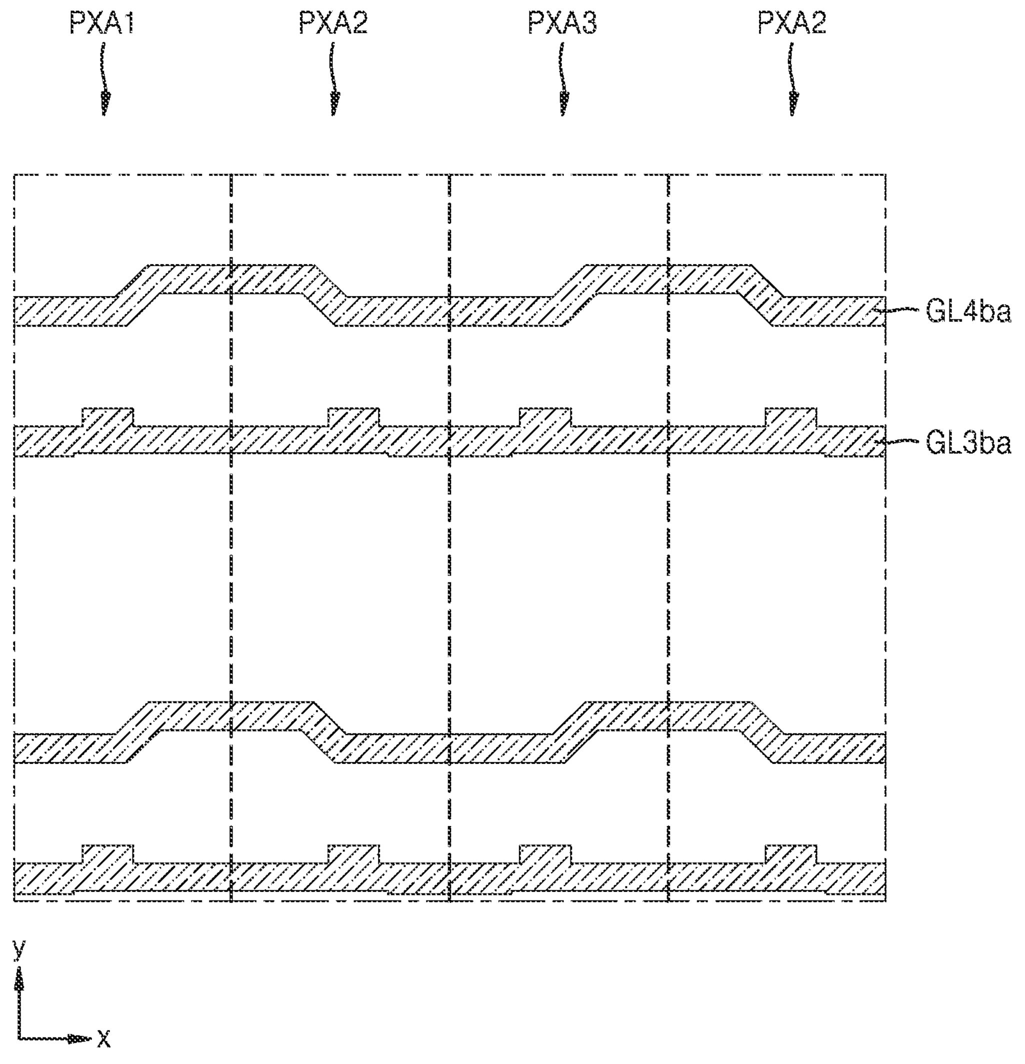

Referring to FIGS. 8 to 10 and FIG. 11G, the third interlayer insulating layer 116 (see FIG. 10) may be disposed on the layer of FIG. 11F. Thereafter, first to fifth connection electrodes NM1, NM2, NM3, NM4, and NM5, a node connection electrode 171, and a second initialization voltage line VIL2 may be formed. The second initialization voltage line VIL2 may extend in the x direction to pass through sub-pixel areas of each row. For example, the fourth connection electrode NM4 may be disposed over the first sub-pixel area PXA1 and the second sub-pixel area PXA2 adjacent to each other. For example, the fifth connection electrode NM5 may be disposed over the first sub-pixel area PXA1 and the second sub-pixel area PXA2 adjacent to each other.

The first connection electrode NM1 may electrically connect the first semiconductor layer A1 of the silicon semiconductor pattern PSL to the third semiconductor layer A3 of the oxide semiconductor pattern OSL. The first connection electrode NM1 may be connected to the second region D1, which is a portion of the first semiconductor layer A1, through a contact hole CNT, and may be connected to the second region D3, which is a portion of the third semiconductor layer A3, through a contact hole CNT. The second connection electrode NM2 may be connected to the first region B2, which is a portion of the second semiconductor layer. The third connection electrode NM3 may be connected to the second region D6, which is a portion of the sixth semiconductor layer of the silicon semiconductor pattern PSL, and may be connected to the first region B7, which is a portion of the seventh semiconductor layer.

An end of the node connection electrode 171 may be connected to the first gate electrode G1 through the hole CE2-H (see FIG. 11D) of the second capacitor electrode CE2, and another end may be connected to the third semiconductor layer A3.

For example, the fourth connection electrode NM4 may extend in the x direction and may be disposed over the second sub-pixel area PXA2 and the third sub-pixel area PXA3 adjacent to each other. The fourth connection electrode NM4 disposed in the second and third sub-pixel areas PXA2 and PXA3 may have a substantially symmetrical shape with respect to an imaginary line between the second sub-pixel area PXA2 and the third sub-pixel area PXA3. The fourth connection electrode NM4 may electrically connect the first initialization voltage line VIL1 to the fourth semiconductor layer of the oxide semiconductor pattern OSL. The fourth connection electrode NM4 may be connected to the first initialization voltage line VIL1 through a contact hole. The fourth connection electrode NM4 may be connected to the first region B4, which is a portion of the fourth semiconductor layer, through a contact hole.

The fifth connection electrode NM5 may be connected to the first region B5, which is a portion of the fifth semiconductor layer, through a contact hole and may be electrically connected to the second capacitor electrode CE2 through a contact hole.

The second initialization voltage line VIL2 may be connected to the first region B7, which is a portion of the seventh semiconductor layer, through a contact hole.

The first to fifth connection electrodes NM1, NM2, NM3, NM4, and NM5, the node connection electrode 171, and the second initialization voltage line VIL2 may include the same material. For example, the second to fifth connection electrodes NM2 to NM5 and the second initialization voltage line VIL2 may include the same material as the first connection electrode NM1 and the node connection electrode 171, described above with reference to FIG. 10. For example, the first to fifth connection electrodes NM1, NM2, NM3, NM4, and NM5, the node connection electrode 171, and the second initialization voltage line VIL2 may each have a triple-layered structure in which a titanium layer, an aluminum layer, and a titanium layer are stacked on each other.

Figure 11G:
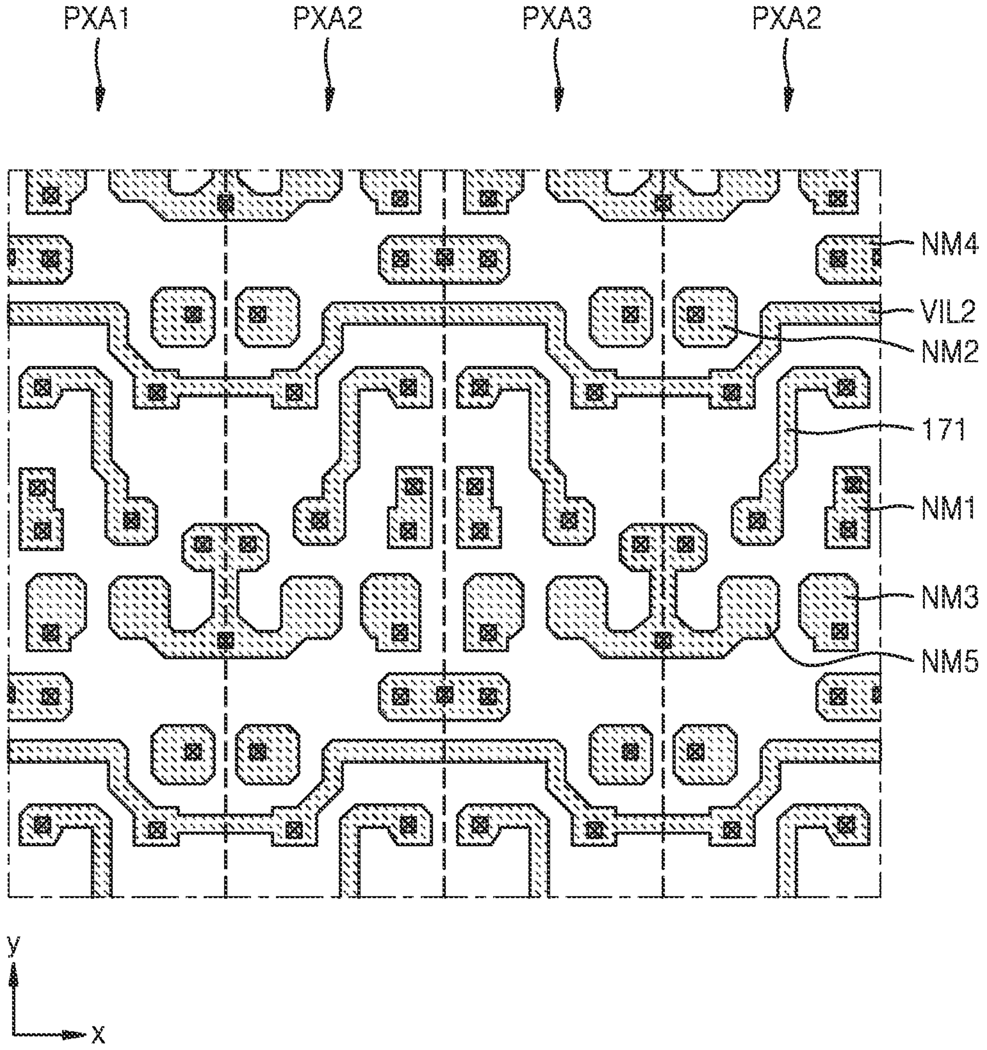

Referring to FIGS. 8 to 10 and FIG. 11H, after the first organic insulating layer 121 (see FIG. 10) is disposed on the layer of FIG. 11G, a data line DL, a driving voltage line PL, a sixth connection electrode NM6, and a seventh connection electrode NM7 may be disposed on the first organic insulating layer 121.

The data line DL and the driving voltage line PL may each extend in the y direction. The data lines DL respectively disposed in the adjacent first and second sub-pixel areas PXA1 and PXA2 may be connected to the second connection electrode NM2 through a third contact hole CH3 defined in the first organic insulating layer 121. Each of the data lines DL may be electrically connected to the second semiconductor layer of the switching transistor T2 through the second connection electrode NM2. The driving voltage line PL may be disposed over the adjacent second and third sub-pixel areas PXA2 and PXA3. As described above, the driving voltage line PL may include main portions PLm and sub-portions PLb connecting the main portions PLm.

The driving voltage line PL may be connected to the fifth connection electrode NM5 through a first contact hole CH1 defined in the first organic insulating layer 121. The driving voltage line PL may be electrically connected to the first region B5, which is a portion of the fifth semiconductor layer, and the second capacitor electrode CE2 through the fifth connection electrode NM5. Portions of the second capacitor electrode CE2 and the fifth connection electrode NM5 extend in the x direction and thus may transmit a driving voltage in the x direction.

The sixth connection electrode NM6 and the seventh connection electrode NM7 may electrically connect a sub-pixel electrode of a light-emitting diode to the third connection electrode NM3 (see FIG. 11G). As described below, the sixth connection electrode NM6 and the seventh connection electrode NM7 may be connected to the sub-pixel electrode of the light-emitting diode through a second contact hole CH2 (see FIG. 11*i*). The sixth connection electrode NM6 and the seventh connection electrode NM7 may be connected to the fourth connection electrode NM4 through a contact hole. A sub-pixel electrode of each light-emitting diode may be electrically connected to the second region D6, which is a portion of the sixth semiconductor layer of the emission control transistor T6, through the fourth connection electrode NM4, and the sixth connection electrode NM6 or the seventh connection electrode NM7.

The data line DL, the sixth connection electrode NM6, and the seventh connection electrode NM7 may include Al, Pt, Pd, Ag, Mg, Au, Ni, Nd, Ir, Cr, Li, Ca, Mo, Ti, W, and/or Cu, and may include a single layer or multiple layers including the aforementioned materials. The data line DL, the sixth connection electrode NM6, and the seventh connection electrode NM7 may include the same material as the driving voltage line PL described above with reference to FIG. 10. For example, the data line DL, the driving voltage line PL, the sixth connection electrode NM6, and the seventh connection electrode NM7 may each include a structure in which a titanium layer, an aluminum layer, and a titanium layer are stacked on each other.

Figure 11H:
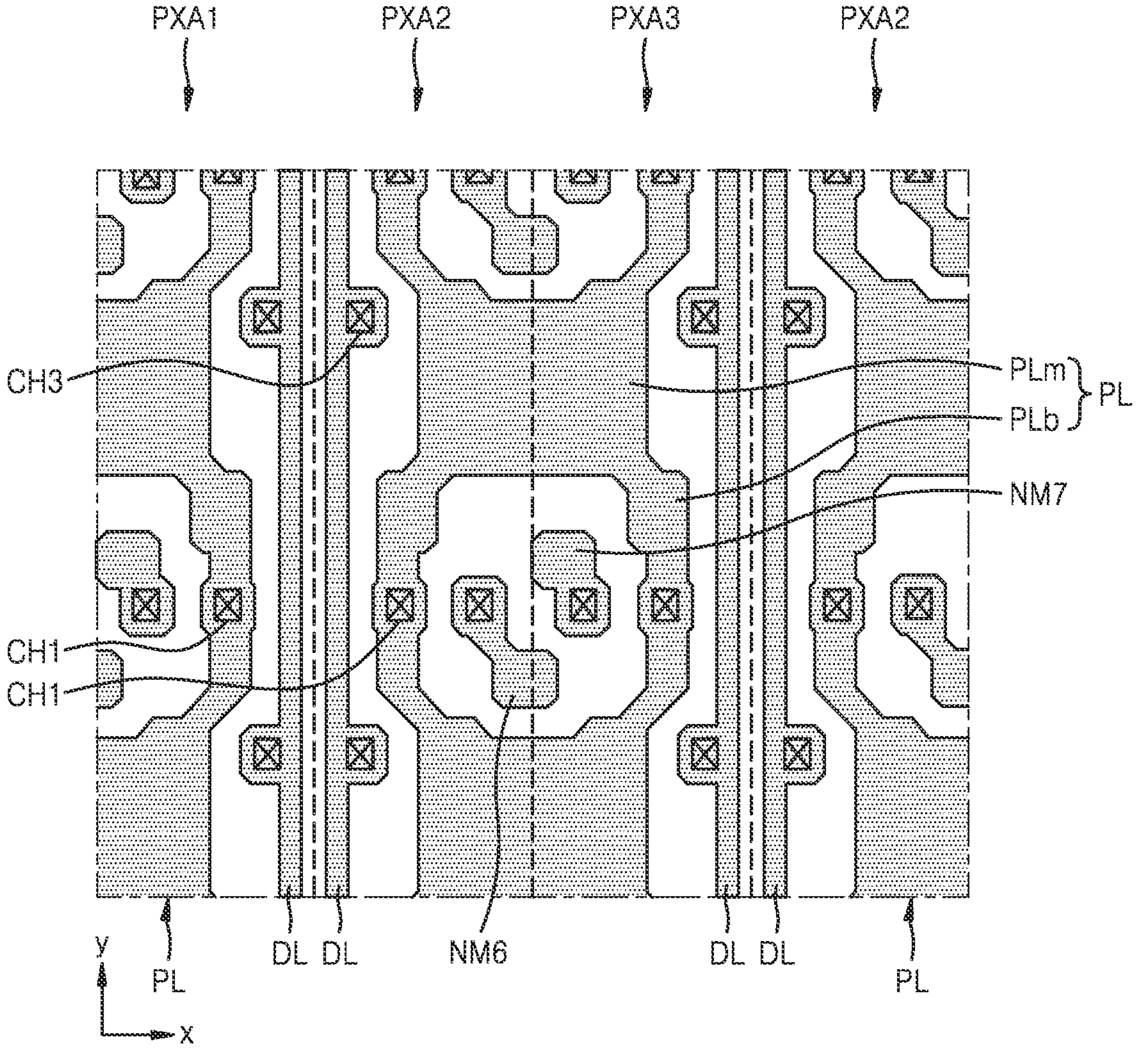
Figure 11I:
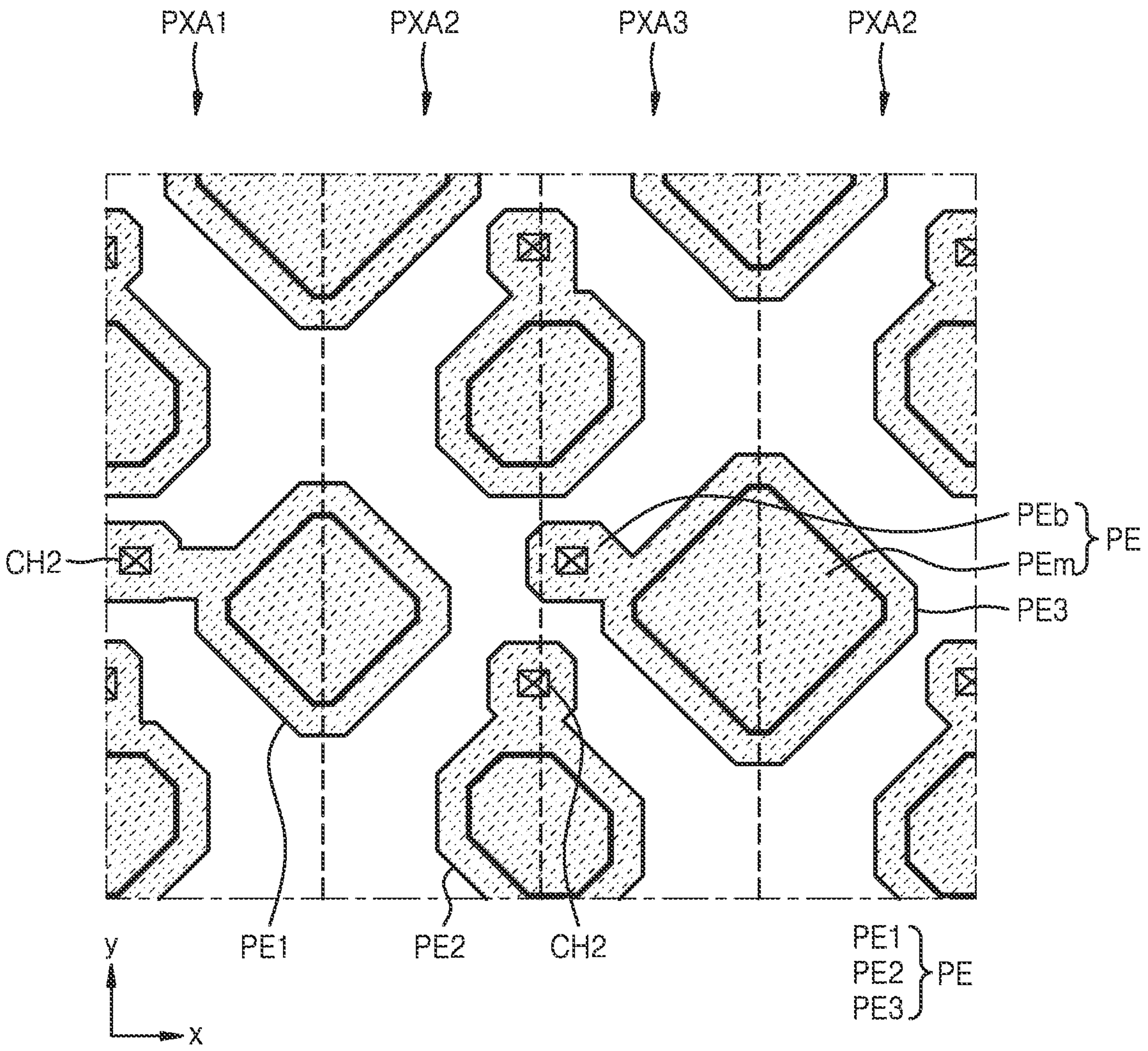

Referring to FIGS. 8 to 10 and FIG. 11I, after the second organic insulating layer 123 (see FIG. 10) is disposed on the layer of FIG. 11H, sub-pixel electrodes PE may be disposed thereon. The sub-pixel electrodes PE may include a first sub-pixel electrode PE1 of a first sub-pixel, a second sub-pixel electrode PE2 of a second sub-pixel, and a third sub-pixel electrode PE3 of a third sub-pixel. Each of the sub-pixel electrodes PE may include a main portion PEm and a protruding portion PEb protruding from the main portion PEm, and the protruding portion PEb of each sub-pixel electrode PE may be connected to the sixth connection electrode NM6 or the seventh connection electrode NM7 through a second contact hole CH2 defined in the second organic insulating layer 123. For example, the first sub-pixel electrode PE1 and the third sub-pixel electrode PE3 may be connected to the seventh connection electrode NM7 through the second contact hole CH2. The second sub-pixel electrode PE2 may be connected to the sixth connection electrode NM6 through the second contact hole CH2.

Each of the first sub-pixel electrode PE1 and the third sub-pixel electrode PE3 may respectively overlap a portion of a sub-pixel area where a sub-pixel circuit, to which each of the first sub-pixel electrode PE1 and the third sub-pixel electrode PE3 are connected, is disposed, and a portion of another sub-pixel area adjacent to the sub-pixel area in the x direction and disposed in another column on the same row as the sub-pixel area. The second sub-pixel electrode PE2 may overlap a portion of a sub-pixel area where a sub-pixel circuit, to which the second sub-pixel electrode PE2 is connected, is disposed, and a portion of another sub-pixel area adjacent to the sub-pixel area in the x direction and y direction and disposed in another row and another column as the sub-pixel area.

Referring to FIGS. 8, 10, 11*h*, and 11*i*, a bank layer PDL (see FIG. 10) covering edges of the first to third sub-pixel electrodes PE1, PE2, and PE3 may be disposed above the first to third sub-pixel electrodes PE1, PE2, and PE3. In the bank layer PDL (see FIG. 10), a first opening OP1 exposing a portion of the first sub-pixel electrode PE1 and defining a first emission area EA1, a second opening OP2 exposing a portion of the second sub-pixel electrode PE2 and defining a second emission area EA2, and a third opening OP3 exposing a portion of the third sub-pixel electrode PE3 and defining a third emission area EA3 may be defined.

Similar to the arrangement structure of the first to third emission areas EA1, EA2, and EA3 described above with reference to FIG. 5, each of the first opening OP1 and the third opening OP3 may overlap at least one first contact hole CH1. Multiple first contact holes CH1 overlapping one first opening OP1 may be vertically symmetrical and horizontally symmetrical with respect to the center of the first opening OP1. Multiple first contact holes CH1 overlapping the third opening OP3 may be vertically symmetrical and horizontally symmetrical with respect to the center of the third opening OP3. The second opening OP2 may entirely overlap the driving voltage line PL. The second emission area EA2 may be disposed inside an edge of the driving voltage line PL (e.g., the main portion PLm of the driving voltage line PL).

Although not shown in the drawings, a first emission layer, a second emission layer, and a third emission layer may be disposed in the first opening OP1, the second opening OP2, and the third opening OP3, respectively, and an opposite electrode 230 (see FIG. 10) may be disposed over the entire surface of the substrate 100 as a common electrode on the first to third emission layers.

In an embodiment, the first emission layer may emit red light, the second emission layer may emit green light, and the third emission layer may emit blue light. In another embodiment, the first emission layer may emit blue light, the second emission layer may emit green light, and the third emission layer may emit red light.

The display apparatus according to an embodiment may reduce an asymmetric color shift phenomenon according to a viewing angle and secure excellent visibility while reducing a characteristic difference between sub-pixels of different colors. However, the scope of the disclosure is not limited by these effects.

It should be understood that embodiments described herein should be considered in a descriptive sense only and not for purposes of limitation. Descriptions of features or aspects within each embodiment should typically be considered as available for other similar features or aspects in other embodiments. While one or more embodiments have been described with reference to the figures, it will be understood by those of ordinary skill in the art that various changes in form and details may be made therein without departing from the spirit and scope of the disclosure.

What is claimed is:

1. A display apparatus, comprising:
a driving voltage line disposed on a substrate and extending in a first direction;
a data line extending in the first direction and apart from the driving voltage line;
a first sub-pixel electrode in which a first emission area is defined; and
a second sub-pixel electrode in which a second emission area is defined, wherein
the first emission area overlaps the data line in a plan view, and
an entirety of the second emission area is disposed inside an edge of the driving voltage line in the plan view.

2. The display apparatus of claim 1, wherein
the driving voltage line includes:
a plurality of main portions; and
a plurality of sub-portions extending in the first direction and connecting the plurality of main portions,
the first emission area overlaps at least one sub-portion of the plurality of sub-portions in the plan view, and
an entirety of the second emission area overlaps one main portion of the plurality of main portions in the plan view.

3. The display apparatus of claim 2, wherein
each of the main portions of the driving voltage line includes a first edge and a second edge, which are disposed opposite to each other,
the second emission area is disposed between the first edge and the second edge,
each of the first edge and the second edge extends parallel to the first direction, and
in the plan view, a shortest distance from the first edge to the second emission area is equal to a shortest distance from the second edge to the second emission area.

4. The display apparatus of claim 2, wherein
each of the main portions of the driving voltage line includes a third edge and a fourth edge, which are disposed opposite to each other with the second emission area therebetween and extend in a second direction perpendicular to the first direction, and
in the plan view, a shortest distance from the third edge to the second emission area is equal to a shortest distance from the fourth edge to the second emission area.

5. The display apparatus of claim 2, wherein
the first emission area emits red light or blue light,
the second emission area emits green light,
the driving voltage line further includes a separation space disposed between neighboring main portions,
the separation space further being disposed between two parallel branches of the sub-portions, and
the main portions being portions of the driving voltage line devoid of the separation space.

6. The display apparatus of claim 1, further comprising:
a lower conductive layer disposed under the driving voltage line; and a first insulating layer disposed between the driving voltage line and the lower conductive layer, wherein a plurality of holes through which the driving voltage line and the lower conductive layer contact each other are defined in the first insulating layer.

7. The display apparatus of claim 6, wherein the plurality of holes include a first hole and a second hole, which overlap one first emission area in the plan view, and the first hole and the second hole are disposed on an imaginary straight line passing, in a second direction perpendicular to the first direction, through a center of the first emission area.

8. The display apparatus of claim 7, wherein the first hole and the second hole are arranged to be symmetrical to each other with respect to an imaginary straight line passing, in the first direction, through the center of the first emission area.

9. The display apparatus of claim 1, wherein the first emission area has a shape symmetrical with respect to a first imaginary straight line passing, in the first direction, through a center of the first emission area, and the first emission area has a shape symmetrical with respect to a second imaginary straight line passing, in a second direction perpendicular to the first direction, through the center of the first emission area.

10. The display apparatus of claim 1, wherein the second emission area has a shape symmetrical with respect to an imaginary straight line passing, in a direction intersecting the first direction and a second direction perpendicular to the first direction, through a center of the second emission area.

11. An electronic device, comprising:

a driving voltage line disposed on a substrate and extending in a first direction;

a data line extending in the first direction and apart from the driving voltage line;

a first sub-pixel electrode overlapping the data line in a plan view;

a second sub-pixel electrode overlapping the driving voltage line in the plan view;

a bank layer overlapping edges of the first and second sub-pixel electrodes;

a first opening corresponding to a portion of the first sub-pixel electrode and defined in the bank layer;

a second opening corresponding to a portion of the second sub-pixel electrode and defined in the bank layer;

a first emission layer corresponding to the first opening, disposed on the bank layer;

a second emission layer corresponding to the second opening, disposed on the bank layer; and an opposite electrode on the first emission layer and the second emission layer, wherein an entirety of the second opening of the bank layer is disposed inside a peripheral edge of the driving voltage line in the plan view.

12. The electronic device of claim 11, wherein the driving voltage line includes:

a plurality of main portions; and a plurality of sub-portions extending in the first direction and connecting the plurality of main portions, the first opening overlaps at least one of the plurality of sub-portions in the plan view, and an entirety of the second opening overlaps one main portion of the plurality of main portions in the plan view.

13. The electronic device of claim 12, wherein each of the main portions of the driving voltage line includes a first edge and a second edge, which are disposed opposite to each other, the second opening is disposed between the first edge and the second edge, each of the first edge and the second edge extends parallel to the first direction, and in the plan view, a shortest distance from the first edge to the second opening is equal to a shortest distance from the second edge to the second opening.

14. The electronic device of claim 12, wherein each of the main portions of the driving voltage line includes a third edge and a fourth edge, which are disposed opposite to each other with the second opening therebetween and extend in a second direction perpendicular to the first direction, and in the plan view, a shortest distance from the third edge to the second opening is equal to a shortest distance from the fourth edge to the second opening.

15. The electronic device of claim 12, wherein the first emission layer emits red light or blue light, the second emission layer emits green light, the driving voltage line further includes a separation space disposed between neighboring main portions, the separation space further being disposed between two parallel branches of the sub-portions, and the main portions being portions of the driving voltage line devoid of the separation space.

16. The electronic device of claim 11, further comprising:

a lower conductive layer disposed under the driving voltage line; and a first insulating layer disposed between the driving voltage line and the lower conductive layer, wherein a plurality of holes through which the driving voltage line and the lower conductive layer contact each other are defined in the first insulating layer.

17. The electronic device of claim 16, wherein the plurality of holes include a first hole and a second hole, which overlap one first opening in the plan view, and the first hole and the second hole are disposed on an imaginary straight line passing, in a second direction perpendicular to the first direction, through a center of the first opening.

18. The electronic device of claim 17, wherein the first hole and the second hole are arranged to be symmetrical to each other with respect to an imaginary straight line passing, in the first direction, through the center of the first opening.

19. The electronic device of claim 11, wherein the first opening has a shape symmetrical with respect to a first imaginary straight line passing, in the first direction, through a center of the first opening, and the first opening has a shape symmetrical with respect to a second imaginary straight line passing, in a second direction perpendicular to the first direction, through the center of the first opening.

20. The electronic device of claim 11, wherein the second opening has a shape symmetrical with respect to an imaginary straight line passing, in a direction intersecting the first direction and a second direction perpendicular to the first direction, through a center of the second opening.

* * * * *